US012635141B2

(12) United States Patent 
Sun et al.

(10) Patent No.: US 12,635,141 B2 
(45) Date of Patent: May 19, 2026

(54) MEMORY DEVICE AND METHOD OF FORMING THE SAME

(71) Applicant: Taiwan Semiconductor Manufacturing Company, Ltd., Hsinchu (TW)

(72) Inventors: Hung-Chang Sun, Kaohsiung (TW); Sheng-Chih Lai, Hsinchu County (TW); Tsuching Yang, Taipei (TW); Yu-Wei Jiang, Hsinchu (TW); Kuo-Chang Chiang, Hsinchu (TW)

(73) Assignee: Taiwan Semiconductor Manufacturing Company, Ltd., Hsinchu (JP)

( * ) Notice: Subject to any disclaimer, the term of this patent is extended or adjusted under 35 U.S.C. 154(b) by 929 days.

(21) Appl. No.: 17/884,586

(22) Filed: Aug. 10, 2022

(65) Prior Publication Data

US 2022/0384487 A1 Dec. 1, 2022

Related U.S. Application Data

(63) Continuation of application No. 17/234,813, filed on Apr. 20, 2021, now Pat. No. 11,696,448.

(Continued)

(51) Int. Cl.
 *H10B 51/20* (2023.01)
 *H01L 21/02* (2006.01)
 (Continued)

(52) U.S. Cl.
 CPC ....... *H10B 51/20* (2023.02); *H01L 21/02565* (2013.01); *H10B 51/30* (2023.02); *H10D 62/80* (2025.01)

(58) Field of Classification Search
 CPC ........ H10B 51/20; H10B 51/30; H10D 62/80; H01L 21/02565
 See application file for complete search history.

(56) References Cited

U.S. PATENT DOCUMENTS

2006/0022283 A1* 2/2006 Thomas ............... H10D 64/685
257/E21.129
2006/0118844 A1 6/2006 Kijima et al.
(Continued)

FOREIGN PATENT DOCUMENTS

| CN | 108987400 | 12/2018 |
| CN | 110729302 | 1/2020 |
| (Continued) | | |

OTHER PUBLICATIONS

"Office Action of China Counterpart Application", issued on Jan. 25, 2024, pp. 1-9.
(Continued)

*Primary Examiner* — Richard A Booth 
(74) *Attorney, Agent, or Firm* — JCIPRNET

(57) ABSTRACT

A device includes a dielectric layer, a conductive layer, electrode layers and an oxide semiconductor layer. The dielectric layer has a first surface and a second surface opposite to the first surface. The conductive layer is disposed on the first surface of the dielectric layer. The electrode layers are disposed on the second surface of the dielectric layer. The oxide semiconductor layer is disposed in between the second surface of the dielectric layer and the electrode layers, wherein the oxide semiconductor layer comprises a material represented by formula 1 ($In_xSn_yTi_zM_mO_n$). In formula 1, $0<x<1$, $0\leq y<1$, $0<z<1$, $0<m<1$, $0<n<1$, and M represents at least one metal.

19 Claims, 46 Drawing Sheets

Related U.S. Application Data

(60) Provisional application No. 63/040,669, filed on Jun. 18, 2020.

(51) Int. Cl.
 _H10B 51/30_ (2023.01)
 _H10D 62/80_ (2025.01)

(56) References Cited

U.S. PATENT DOCUMENTS

| | | | |
|---|---|---|---|
| 2013/0187152 A1 | 7/2013 | Yamazaki et al. | |
| 2018/0315794 A1 | 11/2018 | Kamalanathan et al. | |
| 2018/0350837 A1 | 12/2018 | Yoo et al. | |
| 2019/0259778 A1 | 8/2019 | Yoo | |
| 2020/0027925 A1 | 1/2020 | Eun et al. | |
| 2022/0278208 A1* | 9/2022 | Xu | H10D 64/033 |
| 2025/0318205 A1* | 10/2025 | Lee | H10D 30/6737 |

FOREIGN PATENT DOCUMENTS

| | | |
|---|---|---|
| JP | 2019012857 | 1/2019 |
| KR | 20060063733 | 6/2006 |
| KR | 20150043307 | 4/2015 |
| KR | 20180131118 | 12/2018 |
| KR | 20190105174 | 9/2019 |
| WO | 2014025002 | 2/2014 |

OTHER PUBLICATIONS

"Office Action of Korea Counterpart Application", issued on Sep. 22, 2022, p. 1-p. 7.

* cited by examiner

200

92
52E
52D
52C
52B
52A
52
86
86
86
98A
90
72D
72C
72B
72A
72
C
C'

200

90

92

98A/98B

58

58 { 52 / 72

200

52 {
52E
52D
52C
52B
52A

90

92

98 { 98B / 98A

C'

C 72D
72C
72B
72A

72

58 { 52 / 72

200

52 {
52E
52D
52C
52B
52A
}52

90

102

92
98B
98A } 98

102

72D
72C
72B
72A
72 {
}72

C'

C

200

52 {
52E
52D
52C
52B
52A
} 52

58 { 52 72

92 90
98B
98A

92

104

92 90
98B
98A

92

72D
72C
72B
72A

72

D

D'

MEMORY DEVICE AND METHOD OF FORMING THE SAME

CROSS-REFERENCE TO RELATED APPLICATION

This application is a continuation application of and claims the priority benefit of U.S. patent application Ser. No. 17/234,813, filed on Apr. 20, 2021. The prior application Ser. No. 17/234,813 claims the priority benefit of U.S. provisional application Ser. No. 63/040,669, filed on Jun. 18, 2020. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
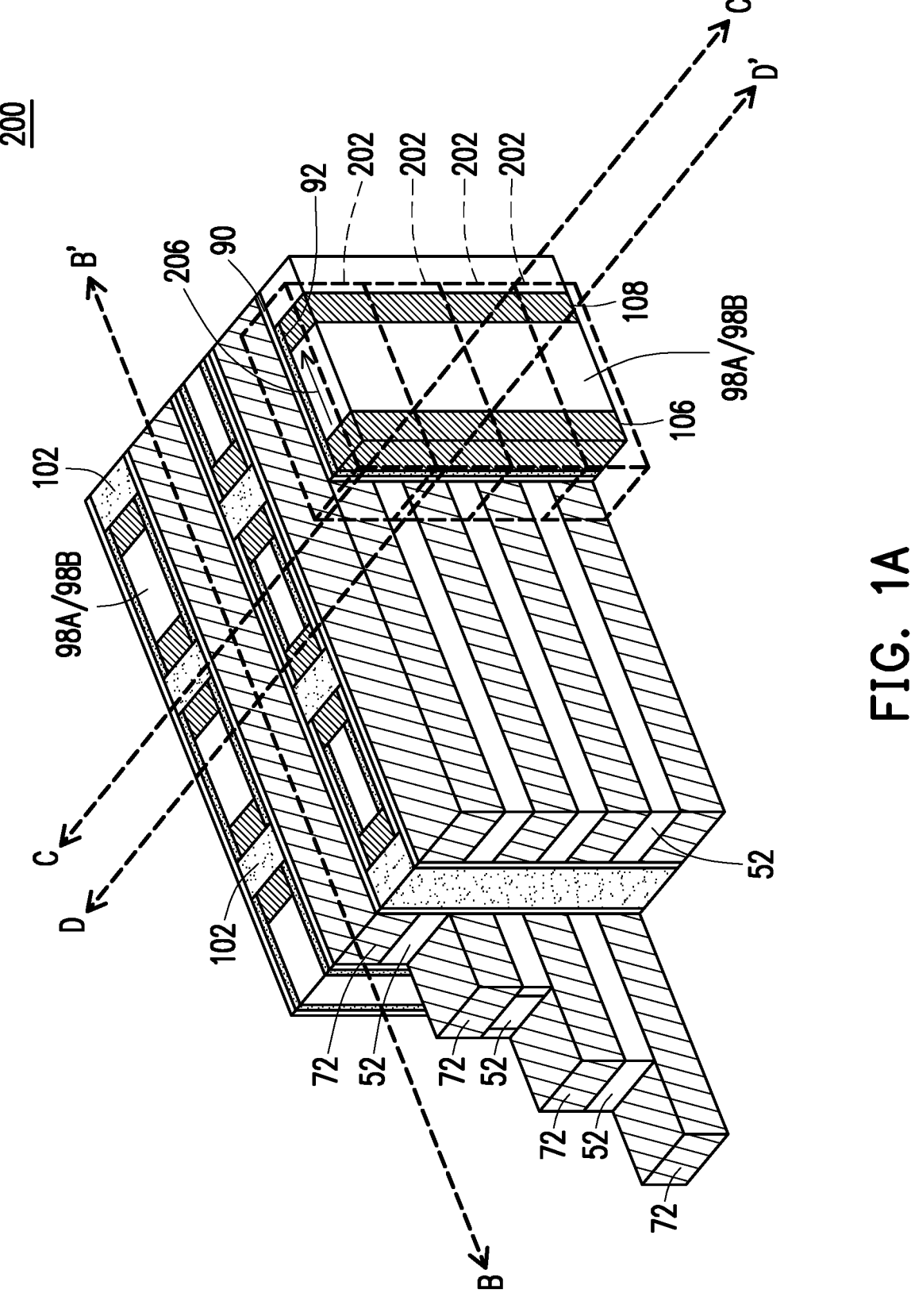
FIG. 1A to FIG. 1C illustrate a simplified perspective view, a circuit diagram, and a top down view of a memory device in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a semiconductor device such as a 3D memory device. In some embodiments, the 3D memory device is a field effect transistor (FET) memory circuit including a plurality of vertically stacked memory cells. In some embodiments, each memory cell of the 3D memory device is regarded as a FET that includes a word line region acting as a gate electrode, a bit line region acting as a first source/drain electrode, and a source line region acting as a second source/drain electrode, a gate dielectric, and an oxide semiconductor (OS) as a channel region. In some embodiments, each memory cell is regarded as a thin film transistor (TFT).

Conventionally, indium gallium zinc oxide (IGZO) are used as oxide semiconductors of the channel region. Although the increase in gallium content can decrease the off-current of the device, which provides improved sub-threshold swing, however, this also degrades the mobility. In addition, zinc related defects are commonly observed in IGZO based oxide semiconductors due to the weak Zn—O bonding. The above issues will deteriorate the stability and mobility of IGZO based transistors. According to various embodiments, a Ga and Zn free metal oxide is used as an oxide semiconductor of the channel region to improve the mobility and device stability of the TFT device.

Figure 1B:
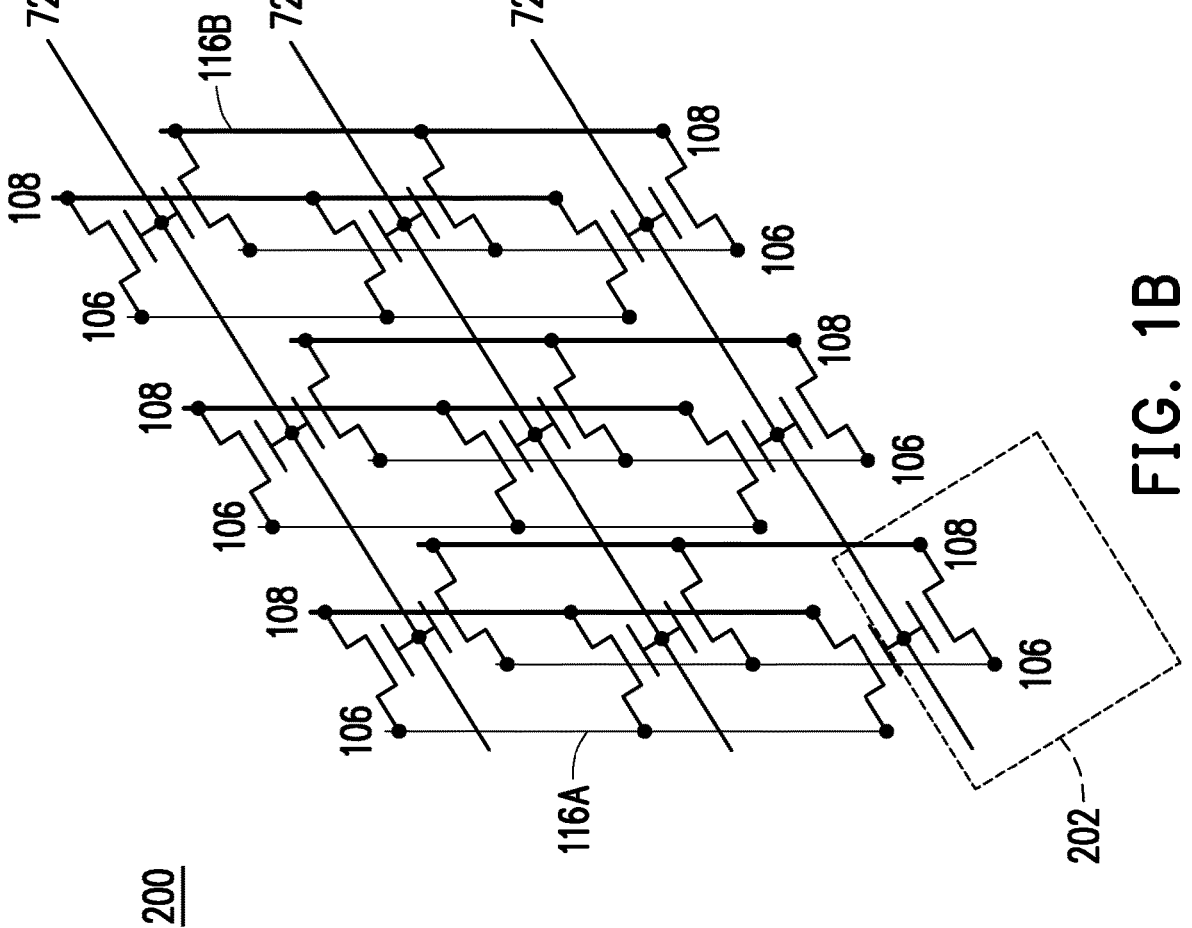
Figure 1C:
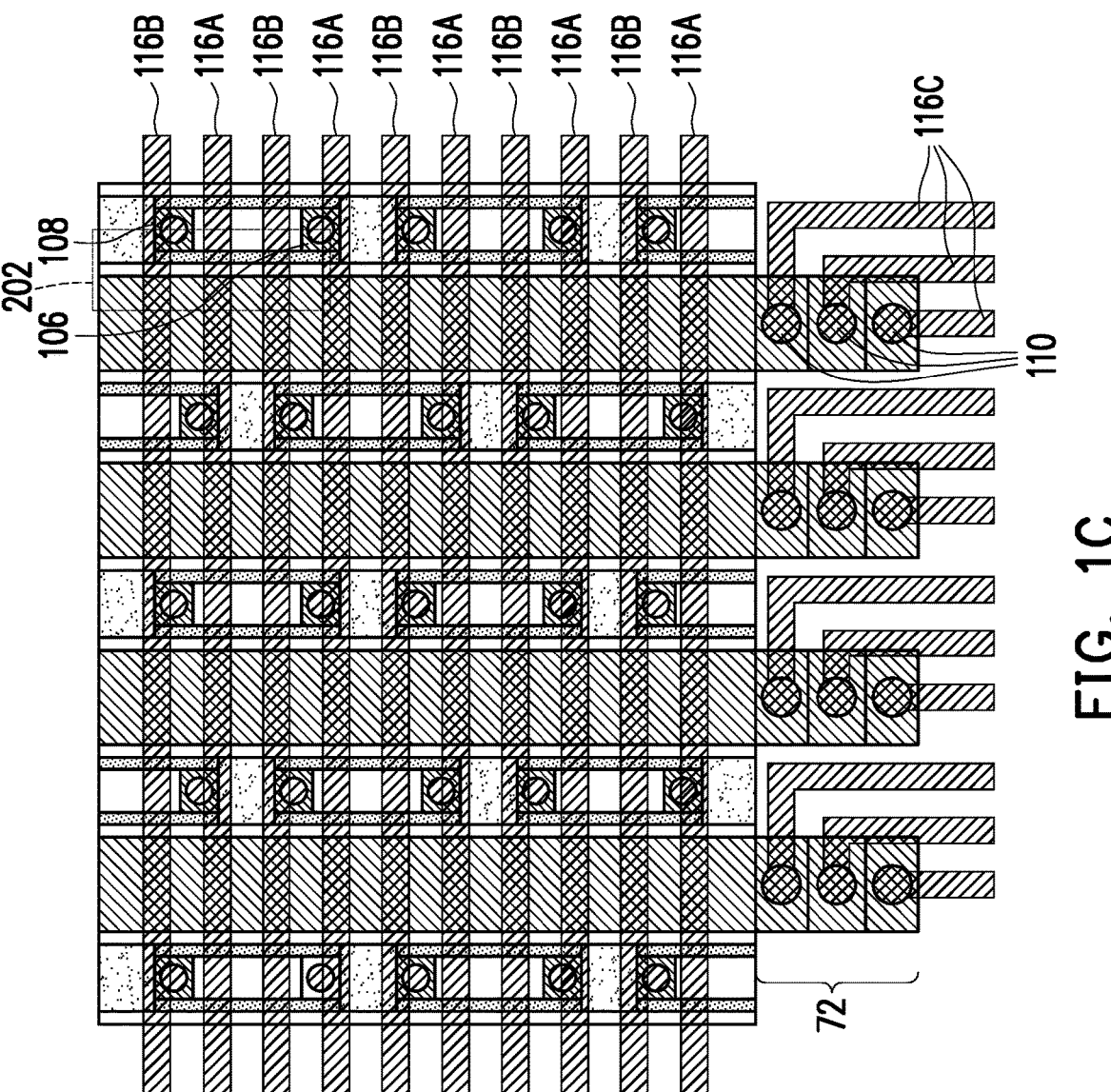

FIGS. 1A, 1B, and 1C illustrate examples of a memory device (or memory array) according to some embodiments. FIG. 1A illustrates an example of a portion of a simplified memory device 200 in a partial three-dimensional view; FIG. 1B illustrates a circuit diagram of the memory device 200; and FIG. 1C illustrates a top down view of the memory device 200 in accordance with some embodiments. The memory device 200 includes a plurality of memory cells 202, which may be arranged in a grid of rows and columns. The memory cells 202 may be further stacked vertically to provide a three-dimensional memory device, thereby increasing device density. The memory device 200 may be disposed in the back end of line (BEOL) of a semiconductor die. For example, the memory device may be disposed in the interconnect layers of the semiconductor die, such as, above one or more active devices (e.g., transistors) formed on a semiconductor substrate.

Referring to FIGS. 1A to 1C, in some embodiments, the memory device 200 is a flash memory device, such as a NOR flash memory device, or the like. In some other embodiments, the memory device 200 is another type of non-volatile memory array, such as a magnetoresistive random-access memory (MRAM) array, a resistive random-access memory (RRAM) array, or the like. In some embodiments, a gate of each memory cell 202 is electrically coupled to a respective word line (e.g., conductive line 72 (or conductive layer)), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the memory device 200 may share a common word line while the memory cells 202 in a same vertical column of the memory device 200 may share a common source line and a common bit line.

The memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory device 200, and conductive contacts may be made to exposed portions of the conductive lines 72, respectively.

The memory device 200 further includes conductive pillars 106 (e.g., electrically connected to bit lines) and conductive pillars 108 (e.g., electrically connected to source lines) arranged alternately. The conductive pillars 106 and 108 (or electrode layers) may each extend in a direction perpendicular to the conductive lines 72. A dielectric material 98A/98B is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the memory device 200 may also include an oxide semiconductor (OS) material as a channel layer 92. The channel layer 92 (or oxide semiconductor layer) may provide channel regions for the memory cells 202. For example, when an appropriate voltage (e.g., higher than a respective threshold voltage ($V_{th}$) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

In some embodiments, the channel layer 92 includes a material represented by formula 1:

$$In_xSn_yTi_zM_mO_n \qquad \text{[formula 1]}$$

wherein in formula 1, $0<x<1$, $0\leq y<1$, $0<z<1$, $0<m<1$, $0<n<1$, and M represents at least one metal. In some embodiments, the metal M represents a metal of an n-type metal oxide. For example, in one embodiment, when the channel layer 92 is made into a thin film of 100 nm, the sheet resistance thereof is $1*10^3$ ohm/sq to $1*10^{10}$ ohm/sq. In certain embodiments, the metal M is at least one of Sc, V, Cr, Cu, Y, Nb, Ru, Ag and W. In some embodiments, the channel layer 92 represented by formula 1 can be used to replace conventional indium gallium zinc oxide (IGZO) based oxide semiconductors to reduce the fabrication costs, while providing high mobility and improving device stability. For example, the $SnO_2$, $In_2O_3$ and $TiO_2$ formed in the channel layer 92 can be used as the network former, mobility enhancer, and charge suppressor, while additional metal doping of the metal M is responsible for increment of carrier concentration. Furthermore, the $TiO_2$ in the channel layer 92 can be used as a charge suppressor, and is relatively inexpensive as compared to Ga.

In some embodiments, a dielectric layer 90 (or ferroelectric layer 90) is disposed between the channel layer 92 and each of the conductive lines 72 and the dielectric layers 52, and the dielectric layer 90 may serve as a gate dielectric for each memory cell 202. In some embodiments, the dielectric layer 90 includes a ferroelectric material, such as a hafnium oxide, hafnium zirconium oxide, silicon-doped hafnium oxide, or the like. In some embodiments, the dielectric layer 90 includes a layer of SiNx between two SiOx layers (e.g., an ONO structure).

In some embodiments, when the dielectric layer 90 includes a ferroelectric material, the dielectric layer 90 may be polarized in one of two different directions, and the polarization direction may be changed by applying an appropriate voltage differential across the dielectric layer 90 and generating an appropriate electric field. The polarization may be relatively localized (e.g., generally contained within each boundaries of the memory cells 202), and a continuous region of the dielectric layer 90 may extend across a plurality of memory cells 202. Depending on a polarization direction of a particular region of the dielectric layer 90 (or ferroelectric layer 90), a threshold voltage of a corresponding memory cell 202 varies, and a digital value (e.g., 0 or 1) can be stored. For example, when a region of the dielectric layer 90 (or ferroelectric layer 90) has a first electrical polarization direction, the corresponding memory cell 202 may have a relatively low threshold voltage, and when the region of the dielectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the dielectric layer 90 (or ferroelectric layer 90) corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). By applying the write voltage across the portion of the dielectric layer 90, a polarization direction of the region of the dielectric layer 90 can be changed. As a result, the corresponding threshold voltage of the corresponding memory cell 202 can also be switched from a low threshold voltage to a high threshold voltage or vice versa, and a digital value can be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the dielectric layer 90 (or ferroelectric layer 90), the memory cell 202 may or may not be turned on. As a result, the conductive pillar 106 may or may not be discharged through the conductive pillar 108 (e.g., a source line that is coupled to ground), and the digital value stored in the memory cell 202 can be determined. As the conductive lines 72 intersect the conductive pillars 106 and 108, individual memory cells 202 may be selected for the read operation.

FIG. 1A further illustrates reference cross-sections of the memory device 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98A/98B and the isolation pillars 102. Cross-section D-D' is perpendicular to cross-section B-B' and extends through the dielectric materials 98A/98B and the conductive pillars 106. Subsequent figures refer to these reference cross-sections for clarity.

Figure 2:
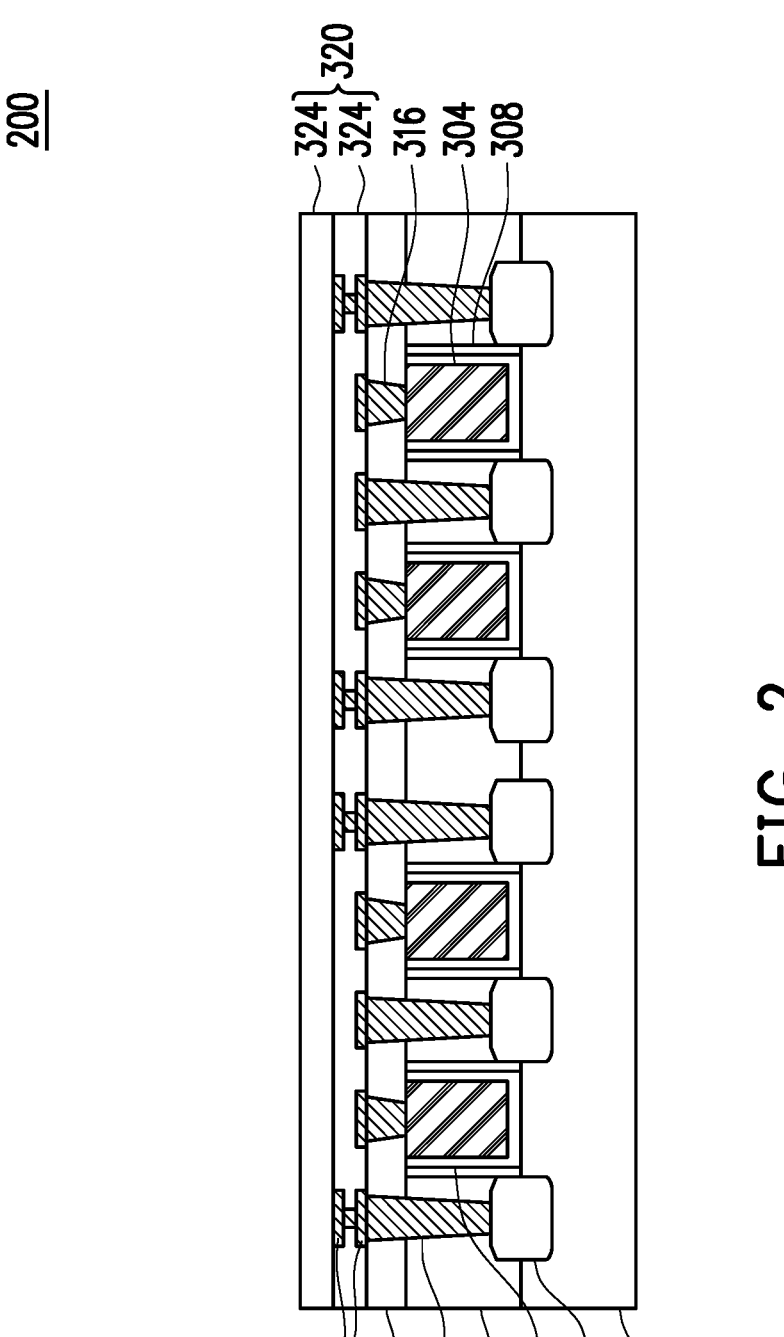
FIG. 2 to FIG. 27E illustrate various views in a method of manufacturing a memory device in accordance with some embodiments of the disclosure.

FIG. 2 through FIG. 27E are various views of intermediate stages in the manufacturing of a memory device, in accordance with some embodiments of the disclosure. Referring to FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
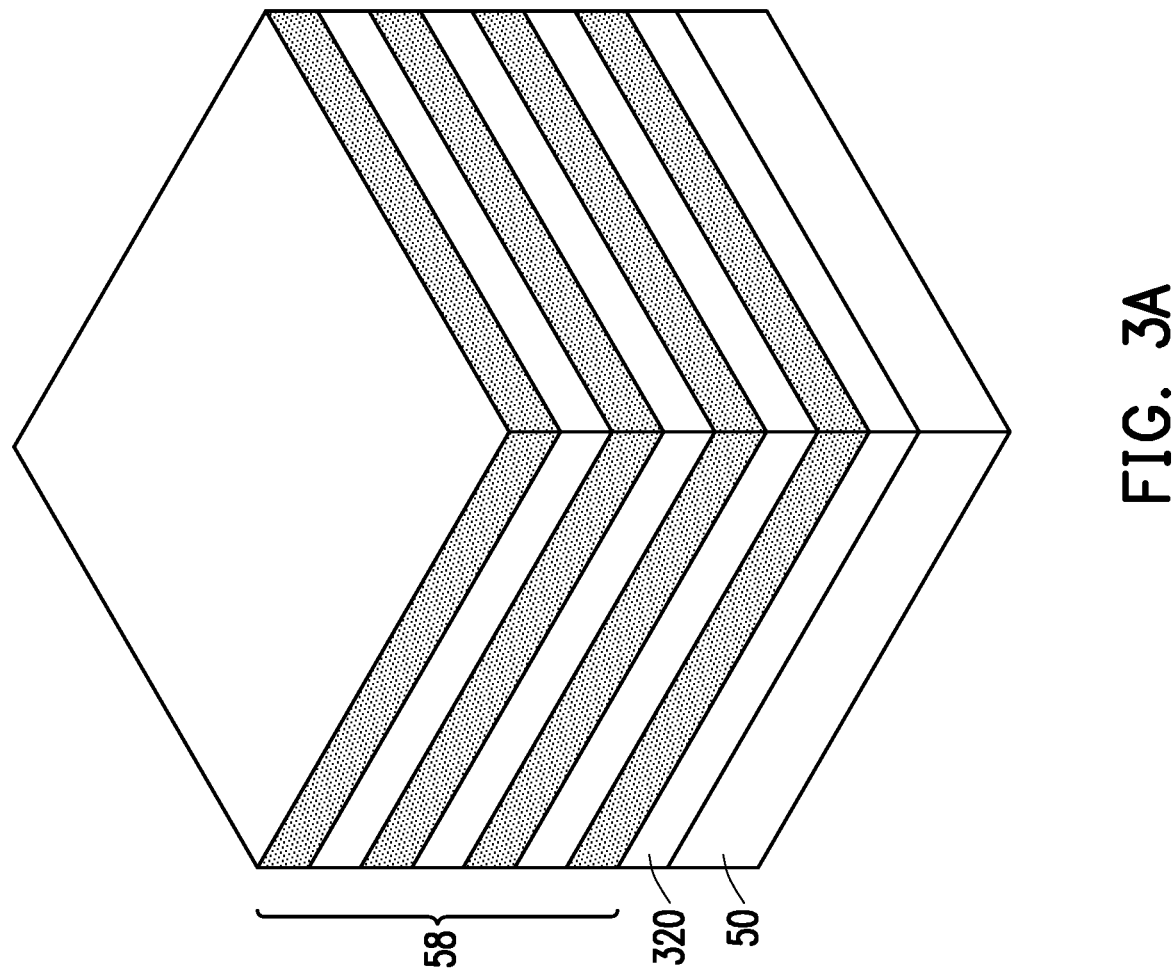
Figure 3B:

Referring to FIGS. 3A and 3B, a multi-layer stack 58 is formed over the structure of FIG. 2. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory device 200 (see FIGS. 1A and 1B). In some embodiments, one or more interconnect layers including conductive features in insulting layers (e.g., low-k dielectric layers) may be disposed over the multi-layer stack 58.

As illustrated in FIGS. 3A and 3B, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIGS. 3A and 3B illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIG. 4 through FIG. 11 and FIG. 12B are various views of intermediate stages in the manufacturing a staircase structure of the memory device 200, in accordance with some embodiments. FIG. 4 through FIG. 11 and FIG. 12B are illustrated along reference cross-section B-B' illustrated in FIG. 1A. FIG. 12A is illustrated as a three-dimensional view of the structure shown in FIG. 12B.

Figure 4:

As illustrated in FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:

As illustrated in FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:

As illustrated in FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
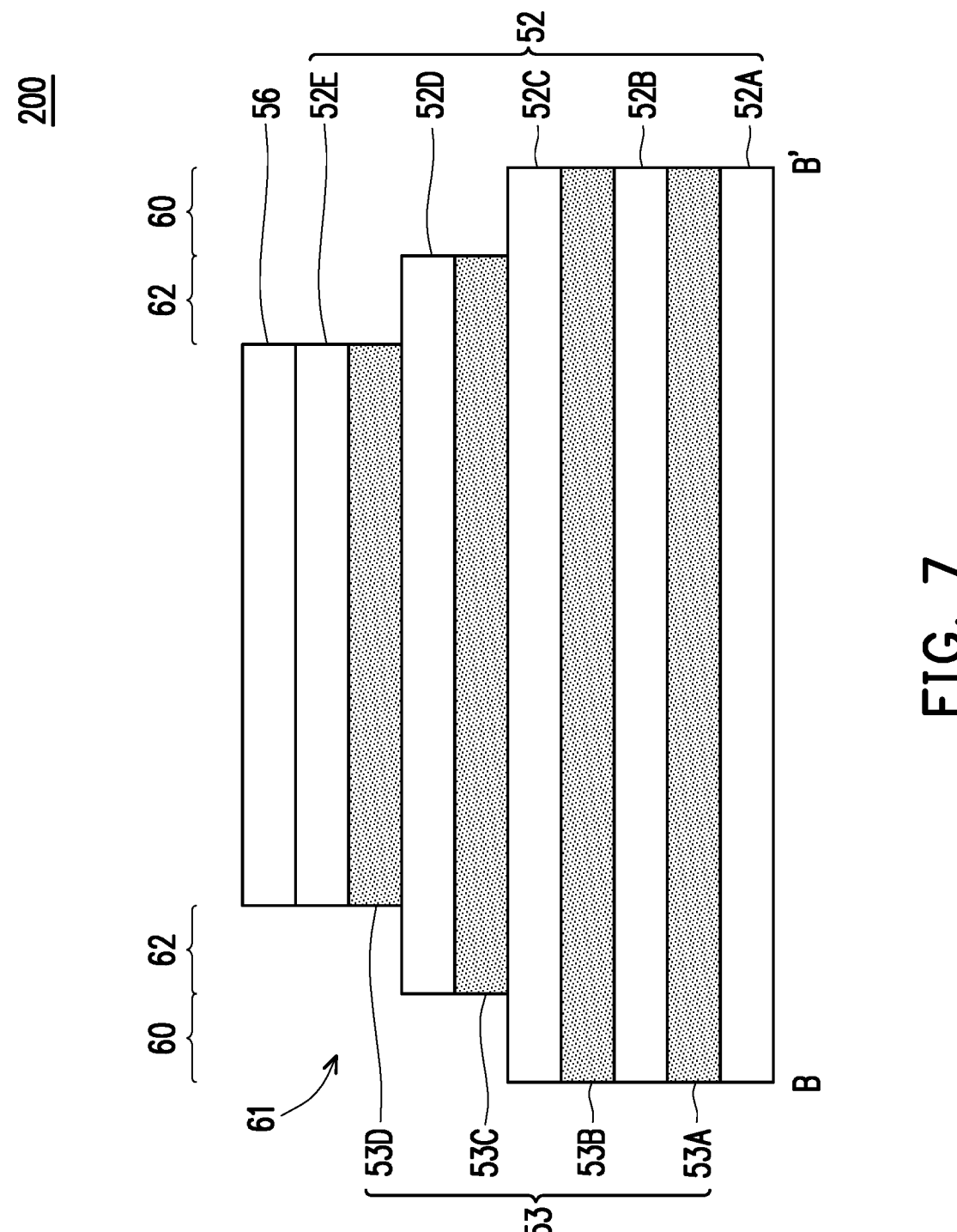

As illustrated in FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
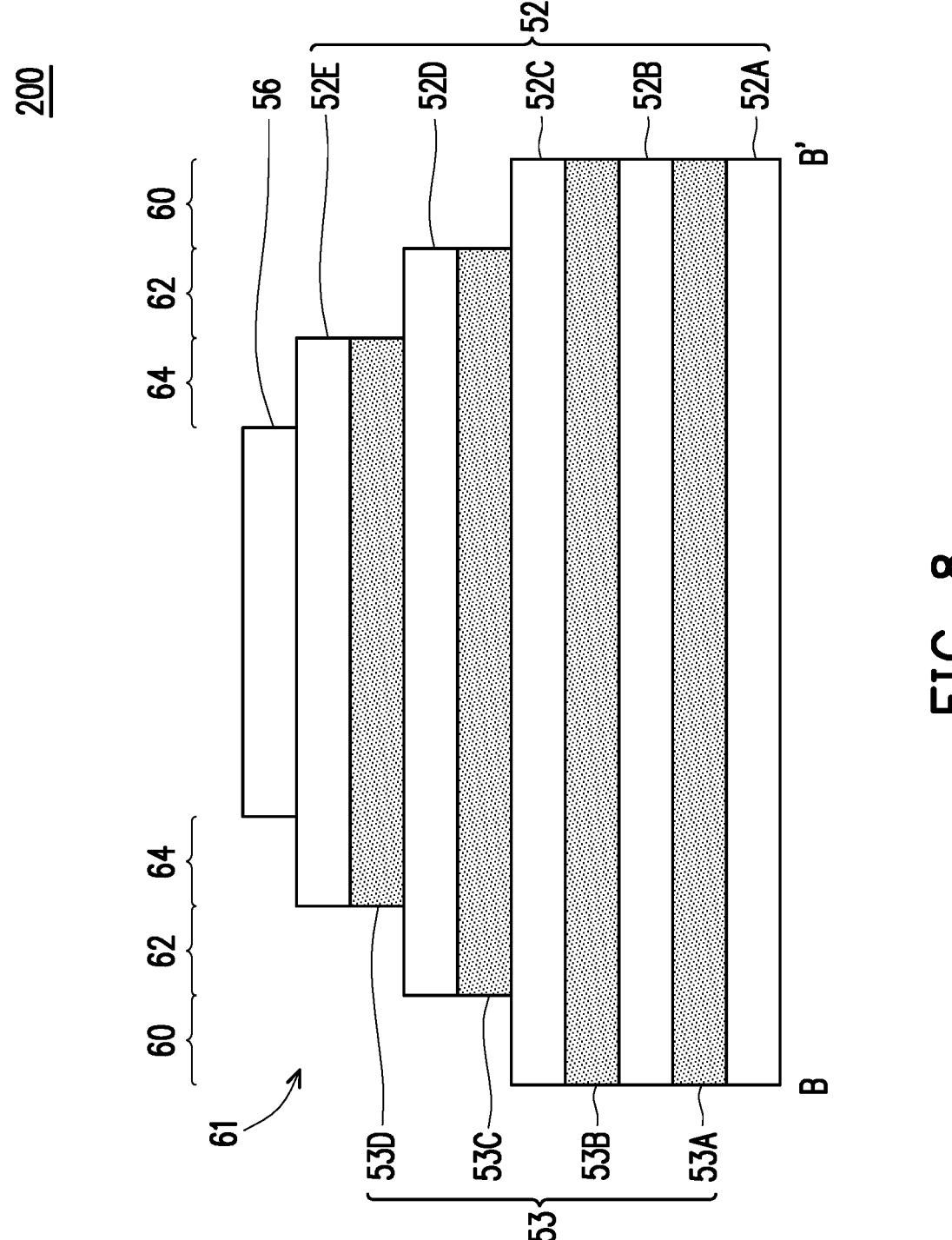

As illustrated in FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:
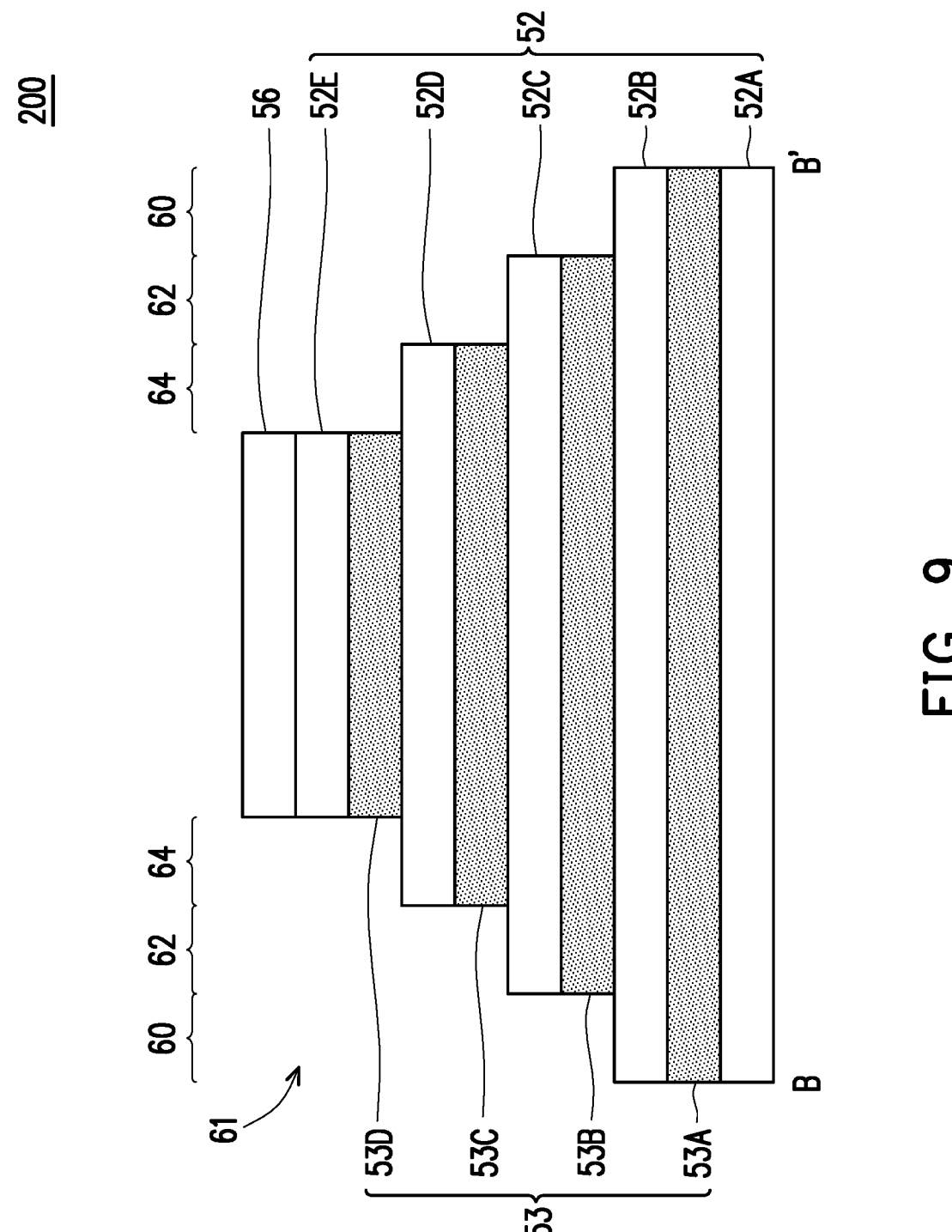

As illustrated in FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
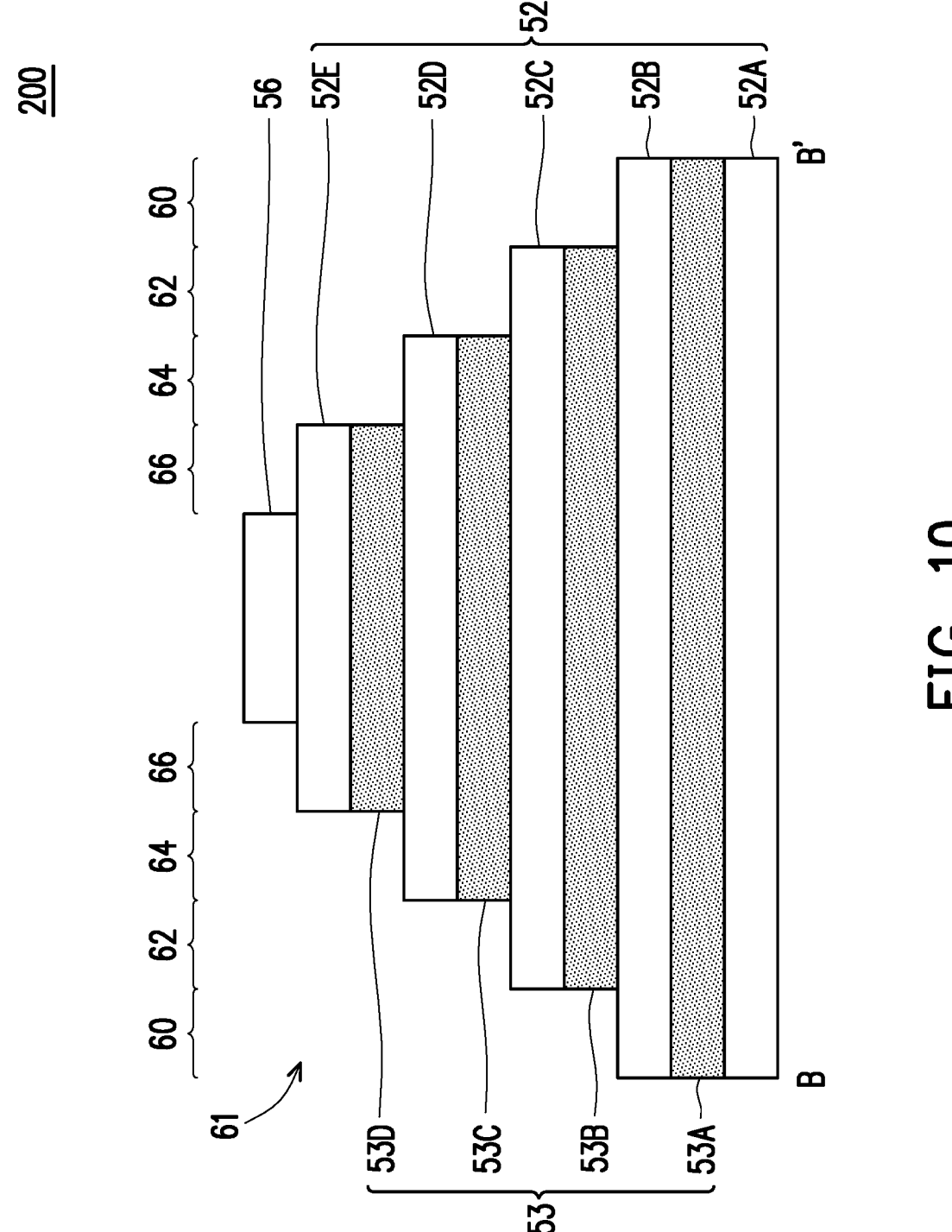

As illustrated in FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 11:
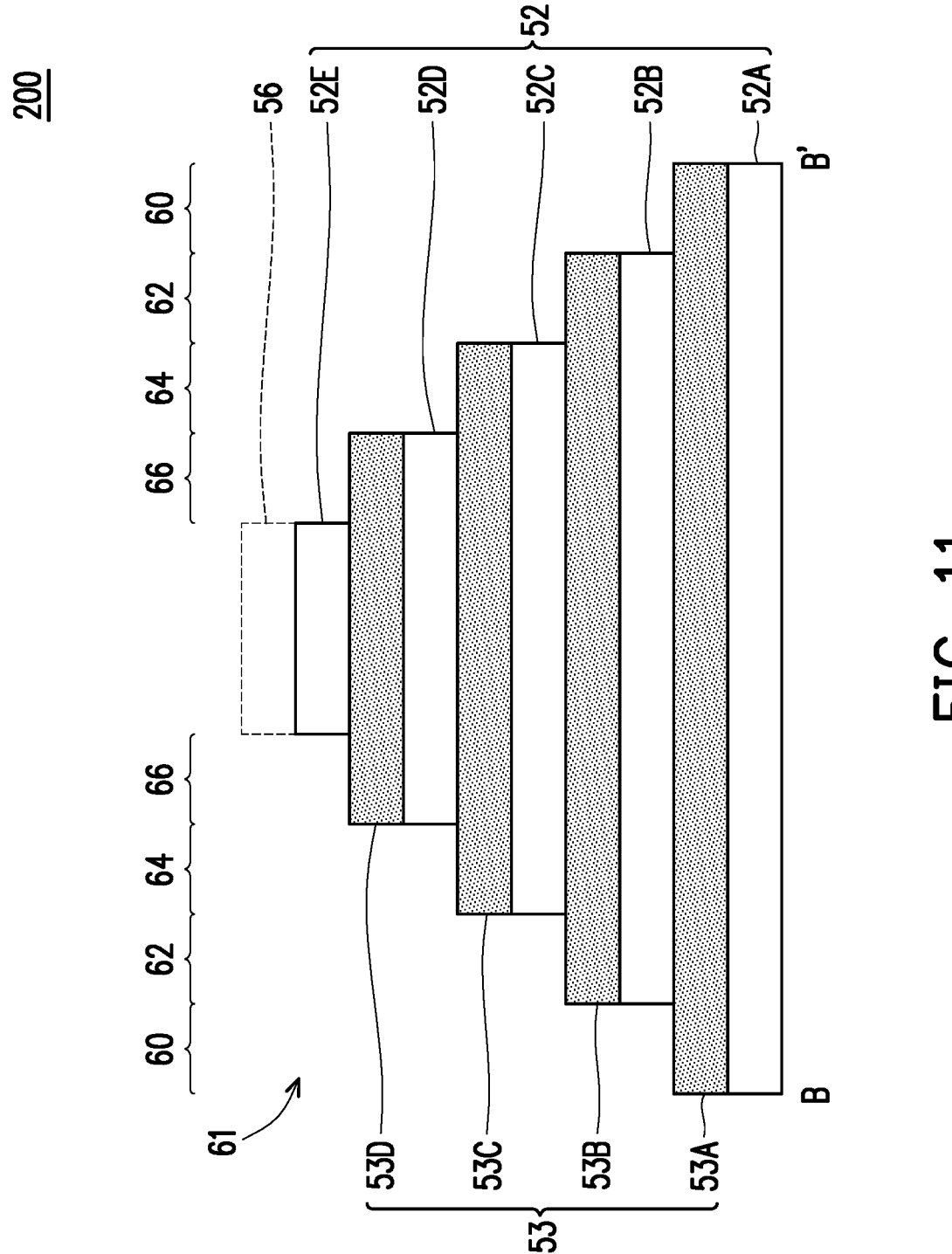
Figure 12A:
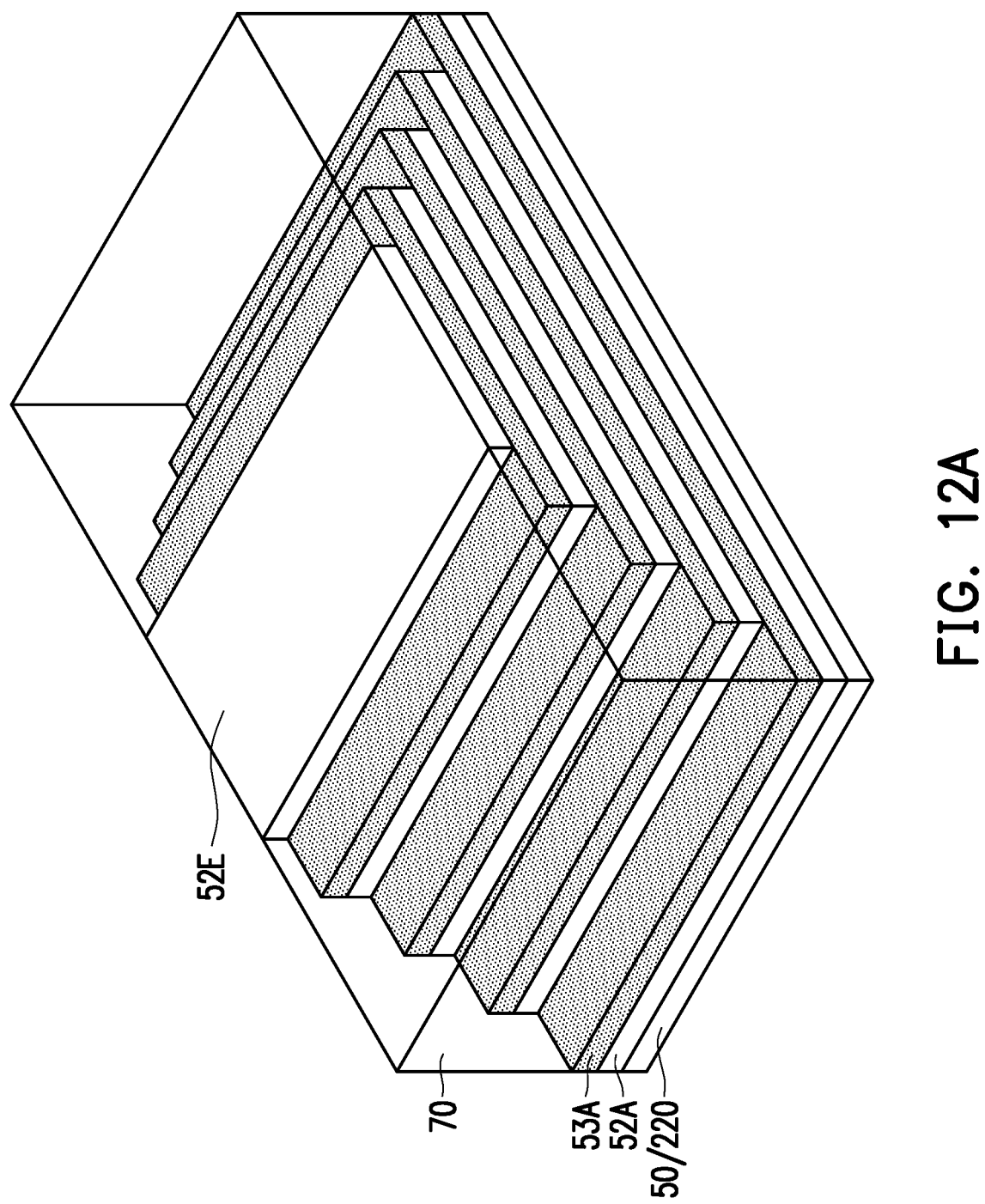

As illustrated in FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12B:

As illustrated in FIGS. 12A and 12B, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Thereafter, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are leveled after the planarization process is completed.

As shown in FIGS. 12A and 12B, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIG. 1A).

FIG. 13 through FIG. 16B are various views of intermediate stages in the manufacturing of a memory region of the memory device 200, in accordance with some embodiments of the disclosure. In FIG. 13 through FIG. 16B, the bulk multi-layer stack 58 is patterned to form trenches 86 therethrough, and sacrificial layers 53 are replaced with conductive materials to define the conductive lines 72. The conductive lines 72 may correspond to word lines in the memory device 200, and the conductive lines 72 may further provide gate electrodes for the resulting memory cells of the memory device 200. FIGS. 13, 14, 15B and 16B are illustrated along reference cross-section C-C' illustrated in FIG. 1A. FIGS. 15A and 16A are illustrated in a partial three-dimensional view.

Figure 13:
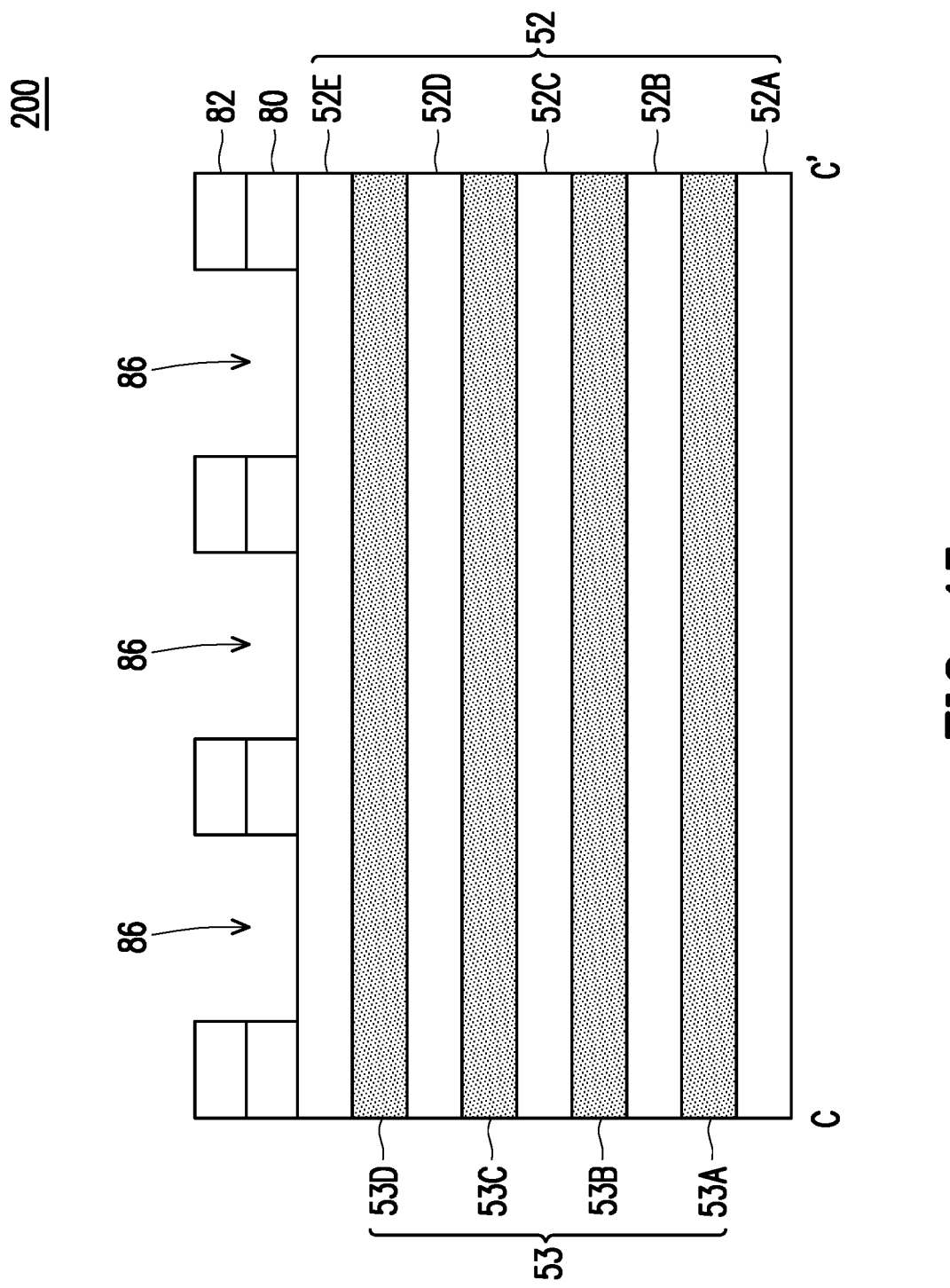

As illustrated in FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist layer is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist 82 may be optionally removed by an ashing process, for example.

Figure 14:
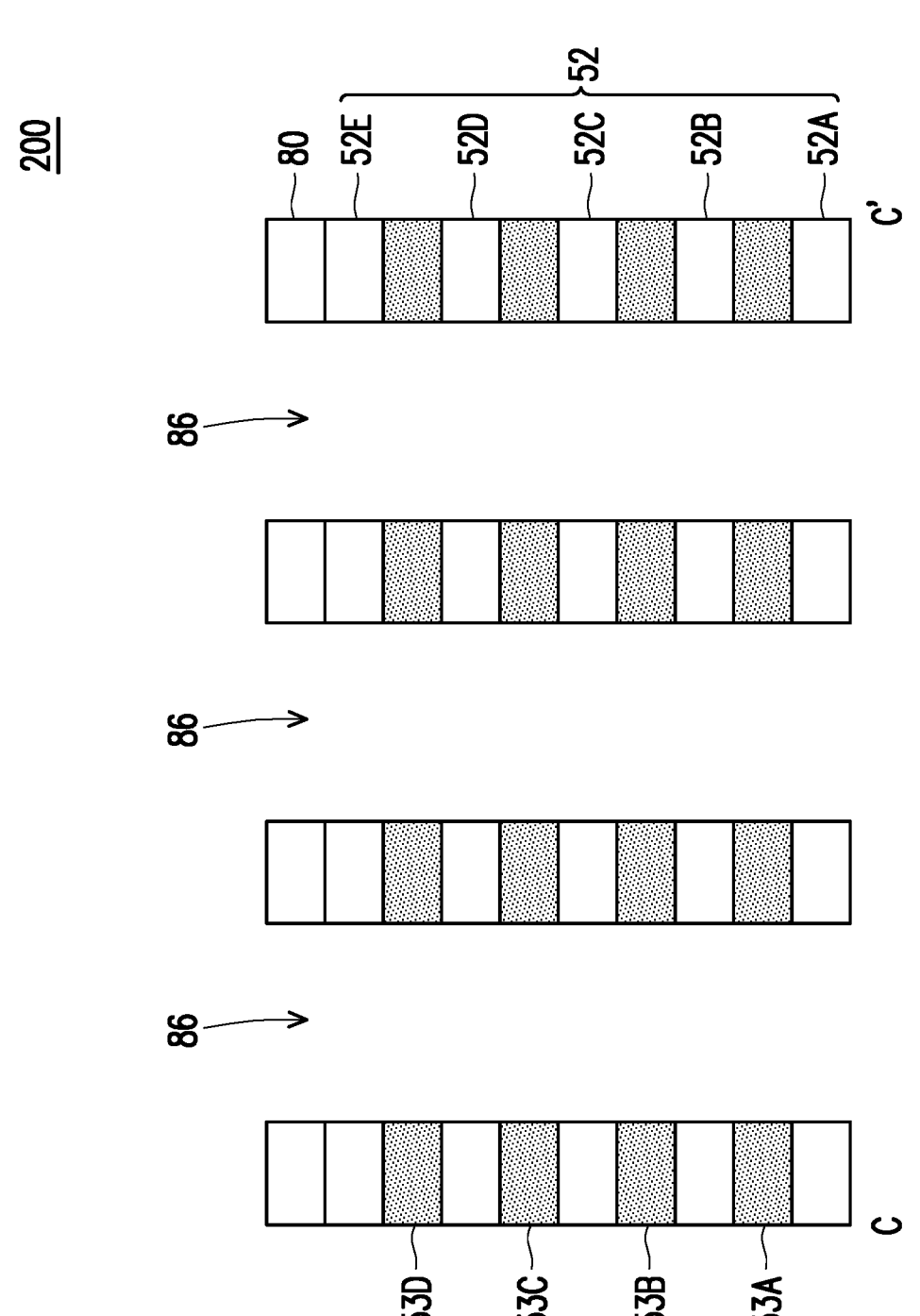
Figure 15A:
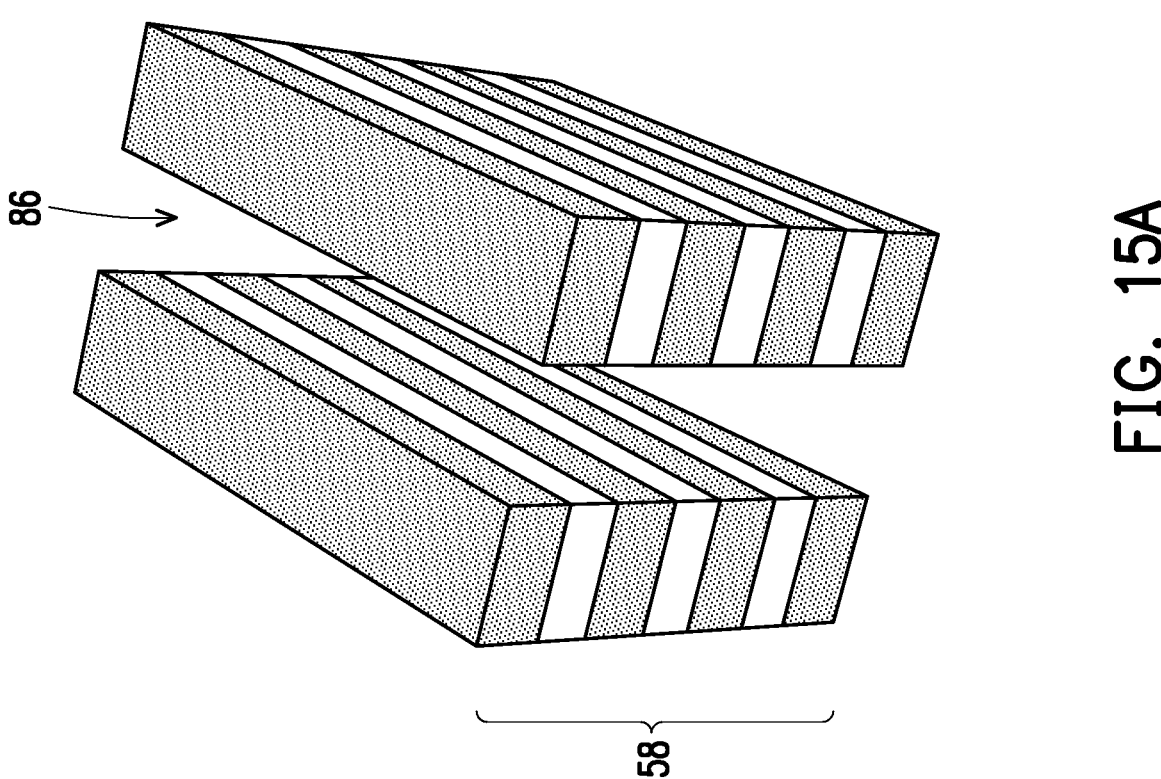
Figure 15B:
Figure 15B:
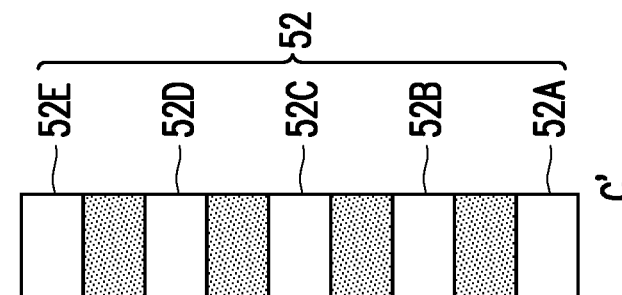
Figure 15B:
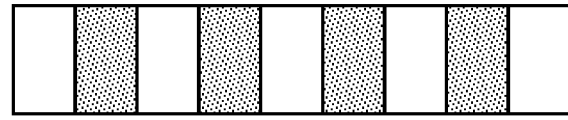
Figure 15B:
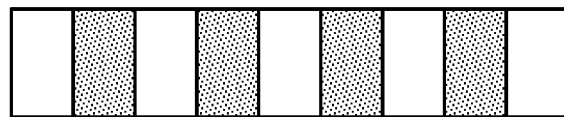
Figure 15B:
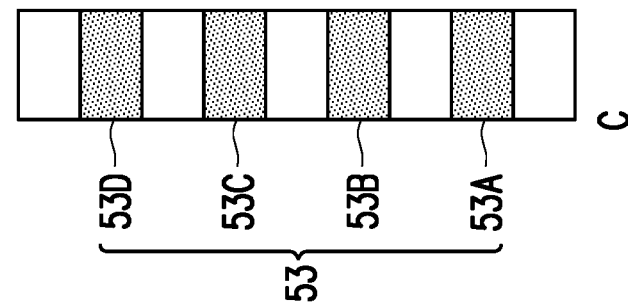

As illustrated in FIGS. 14 to 15B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

Figure 16A:
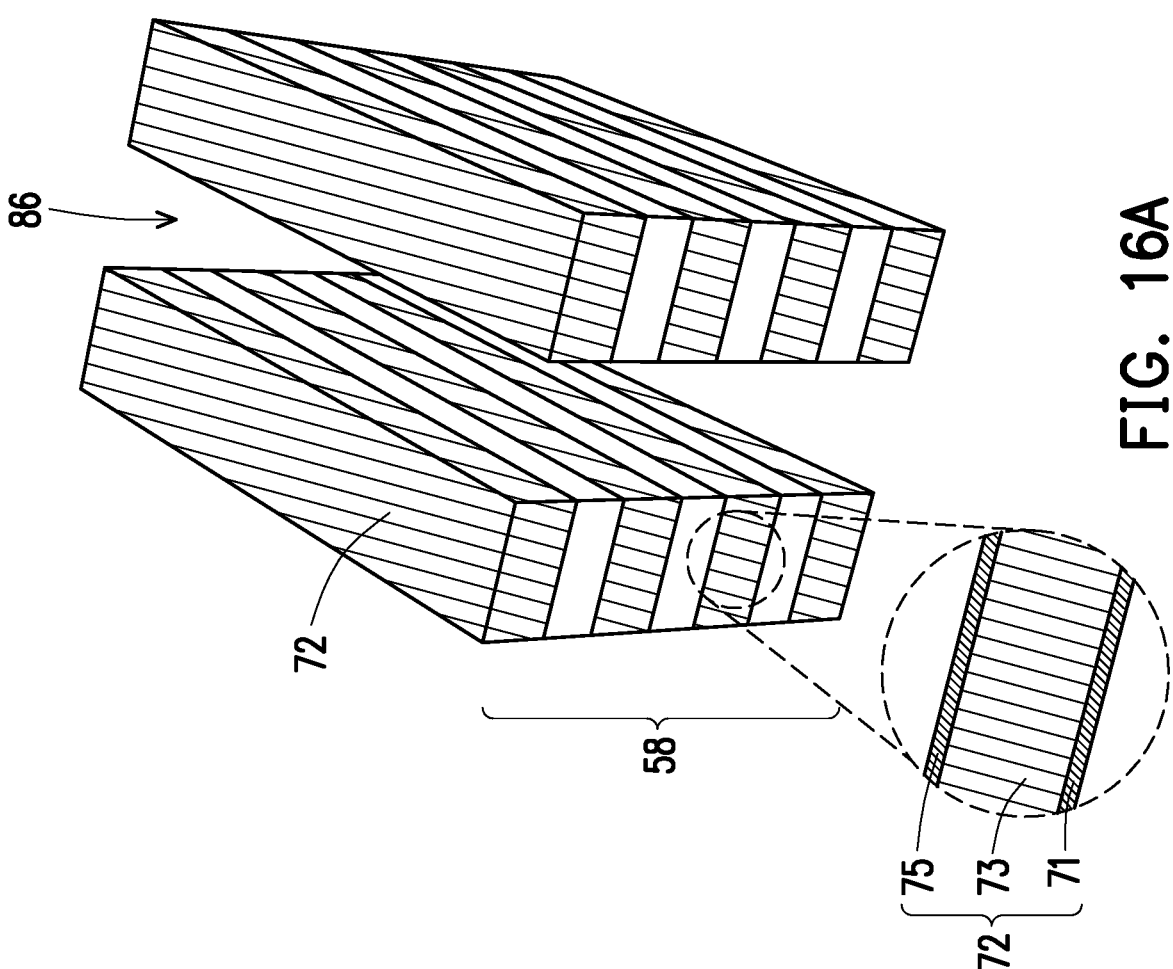
Figure 16B:
Figure 16B:
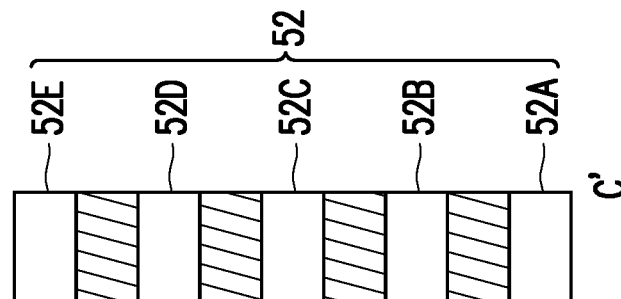
Figure 16B:
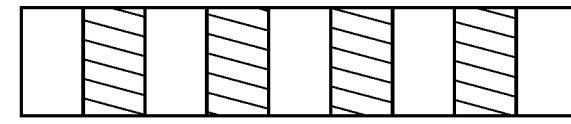
Figure 16B:
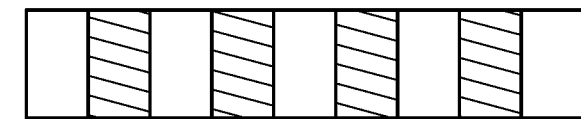
Figure 16B:
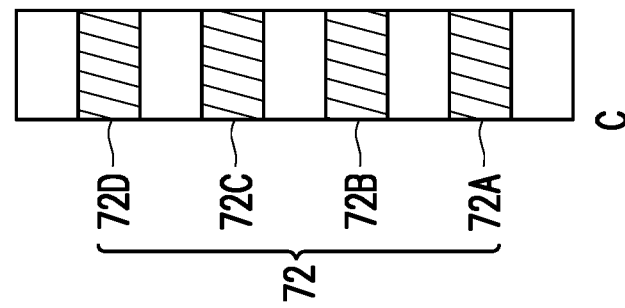

As illustrated in FIGS. 16A and 16B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. Thereafter, conductive lines 72 are filled into the space between two adjacent dielectric layers 52. As shown in the local enlarged view, each conductive line 72 includes two barrier layers 71 and 75 and a metal layer 73 between the barrier layers 71 and 75. In some embodiments, a barrier layer is disposed between the metal layer 73 and the adjacent dielectric layer 52. The barrier layers may prevent the metal layer from diffusion to the adjacent dielectric layers 52. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may are formed of a second conductive material, such as a metal, such as tungsten, ruthenium, molybdenum, cobalt, aluminum, nickel, copper, silver, gold, alloys thereof, or the like. The barrier layers 71, 75 and metal layer 73 may each be formed by an acceptable deposition process such as CVD, PVD, ALD, PECVD, or the like. The barrier layers 71, 75 and the metal layer 73 are further deposited on the sidewalls of the multi-layer stack 58 and fill in the trenches 86. Thereafter, the barrier layers 71, 75 and the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

Figure 17A:
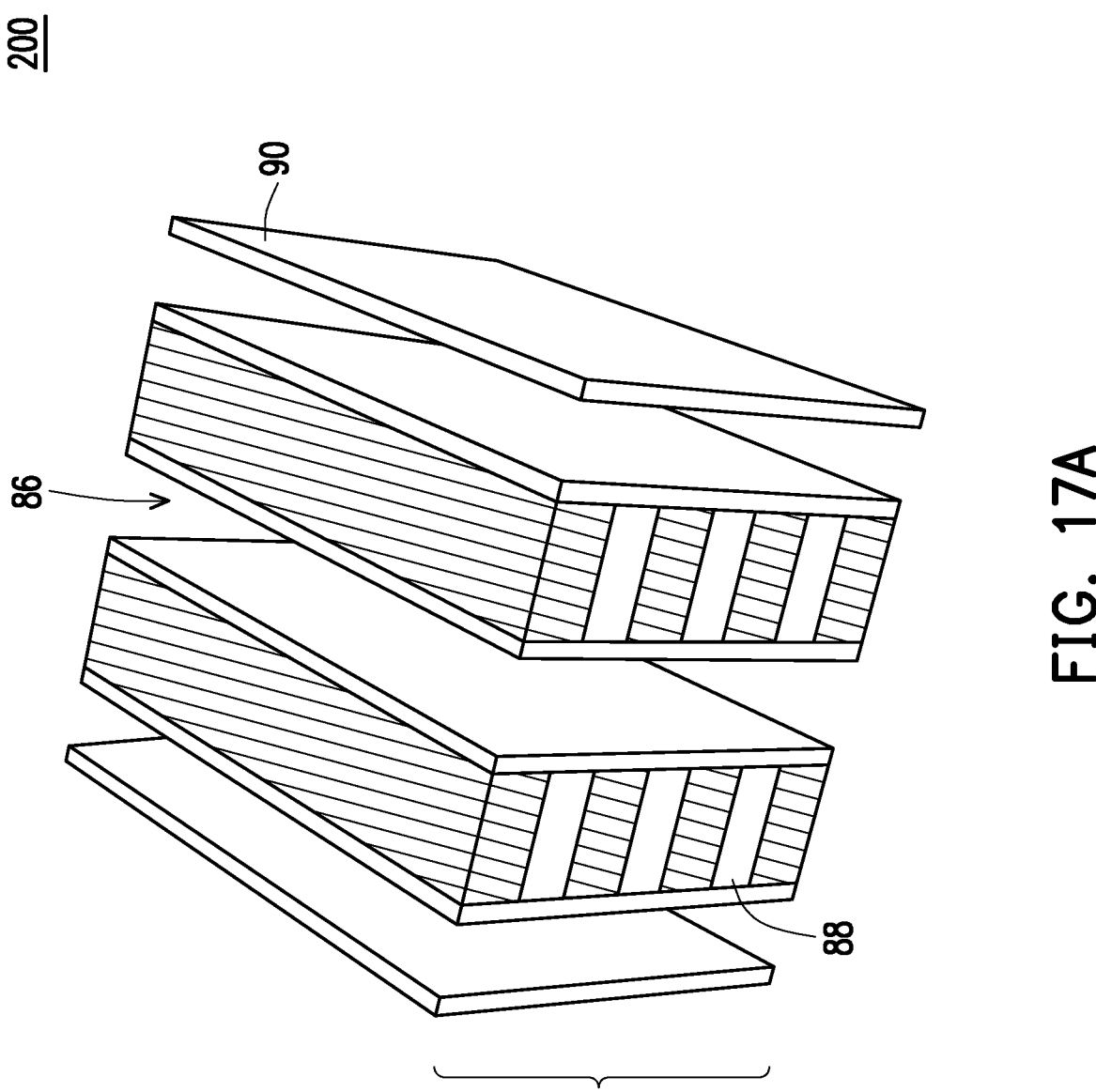

FIG. 17A through FIG. 22B illustrate forming and patterning channel regions for the memory cells 202 (see FIG. 1A) in the trenches 86. FIGS. 17A, 18A and 22A are illustrated in a partial three-dimensional view. In FIGS. 17B, 18B, 19, 20, 21 and 22B cross-sectional views are provided along line C-C' of FIG. 1A. As illustrated in FIG. 17A through FIG. 20, a dielectric layer 90 (ferroelectric layer), a channel layer 92 (oxide semiconductor layer), and a dielectric material 98A are deposited in the trenches 86.

Figure 17B:
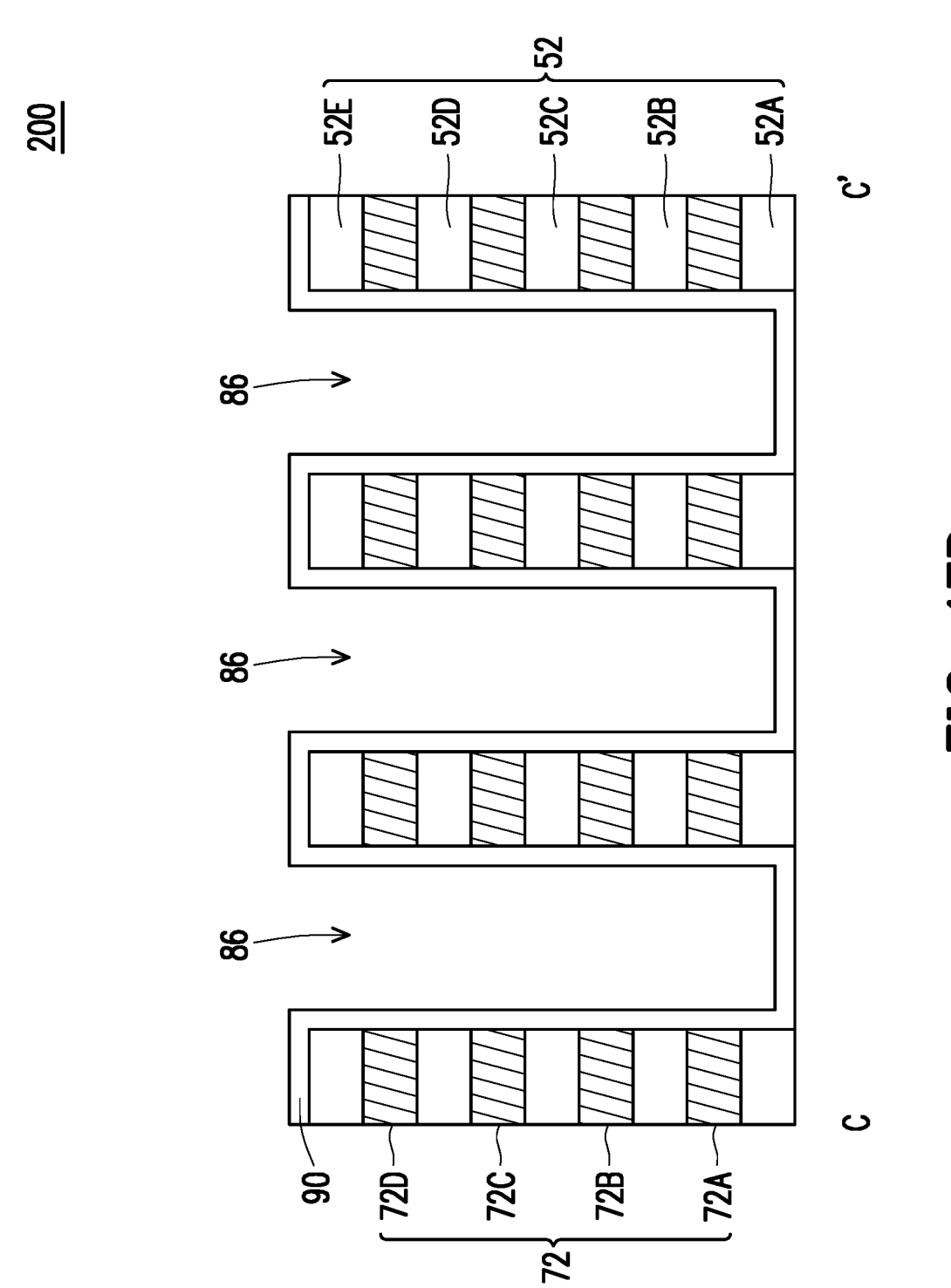

As illustrated in FIG. 17A and FIG. 17B, a dielectric layer 90 (or ferroelectric layer) may be deposited conformally in the trenches 86 along sidewalls of the conductive lines 72, sidewalls of the dielectric layers 52, over top surfaces of the dielectric layer 52E and along the bottom surfaces of the trenches 86. In some embodiments, a dielectric layer 90 (or ferroelectric layer) may be further deposited on the IMD 70 and along the sidewall of each step of the staircase structure in the staircase region. The dielectric layer 90 (or ferroelectric layer) may include materials that are capable of switching between two different polarization directions by applying an appropriate voltage differential across the dielectric layer 90. For example, the dielectric layer 90 includes a high-k dielectric material, such as a hafnium (Hf) based dielectric materials or the like. In some embodiments, the dielectric layer 90 includes hafnium oxide, hafnium zirconium oxide, silicon-doped hafnium oxide, or the like.

In some other embodiments, the dielectric layer 90 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. In some embodiments, the dielectric layer 90 may include different ferroelectric materials or different types of memory materials. For example, in some embodiments, the dielectric layer 90 is a non-ferroelectric material, such as a multilayer memory structure including a layer of $SiN_x$ between two $SiO_x$ layers (e.g., an ONO structure). In some embodiments, the method of forming the dielectric layer 90 includes performing a suitable deposition technique, such as CVD, PECVD, metal oxide chemical vapor deposition (MOCVD), ALD, RPALD, PEALD, MBD or the like.

In some embodiments, the dielectric layer 90 has a thickness of about 1-20 nm, such as 5-10 nm. Other thickness ranges (e.g., more than 20 nm or 5-15 nm) may be applicable. In some embodiments, the dielectric layer 90 is formed in a fully amorphous state. In alternative embodiments, the dielectric layer 90 is formed in a partially crystalline state; that is, the dielectric layer 90 is formed in a mixed crystalline-amorphous state and having some degree of structural order. In yet alternative embodiments, the dielectric layer 90 is formed in a fully crystalline state. In some embodiments, the dielectric layer 90 is a single layer. In alternative embodiments, the dielectric layer 90 is a multi-layer structure.

In some embodiments, an annealing process is performed to the dielectric layer 90. In some embodiments, upon the annealing process, the dielectric layer 90 is transformed from an amorphous state to a partially or fully crystalline state. In alternative embodiments, upon the annealing process, the dielectric layer 90 is transformed from a partially crystalline state to a fully crystalline state.

Figure 18A:
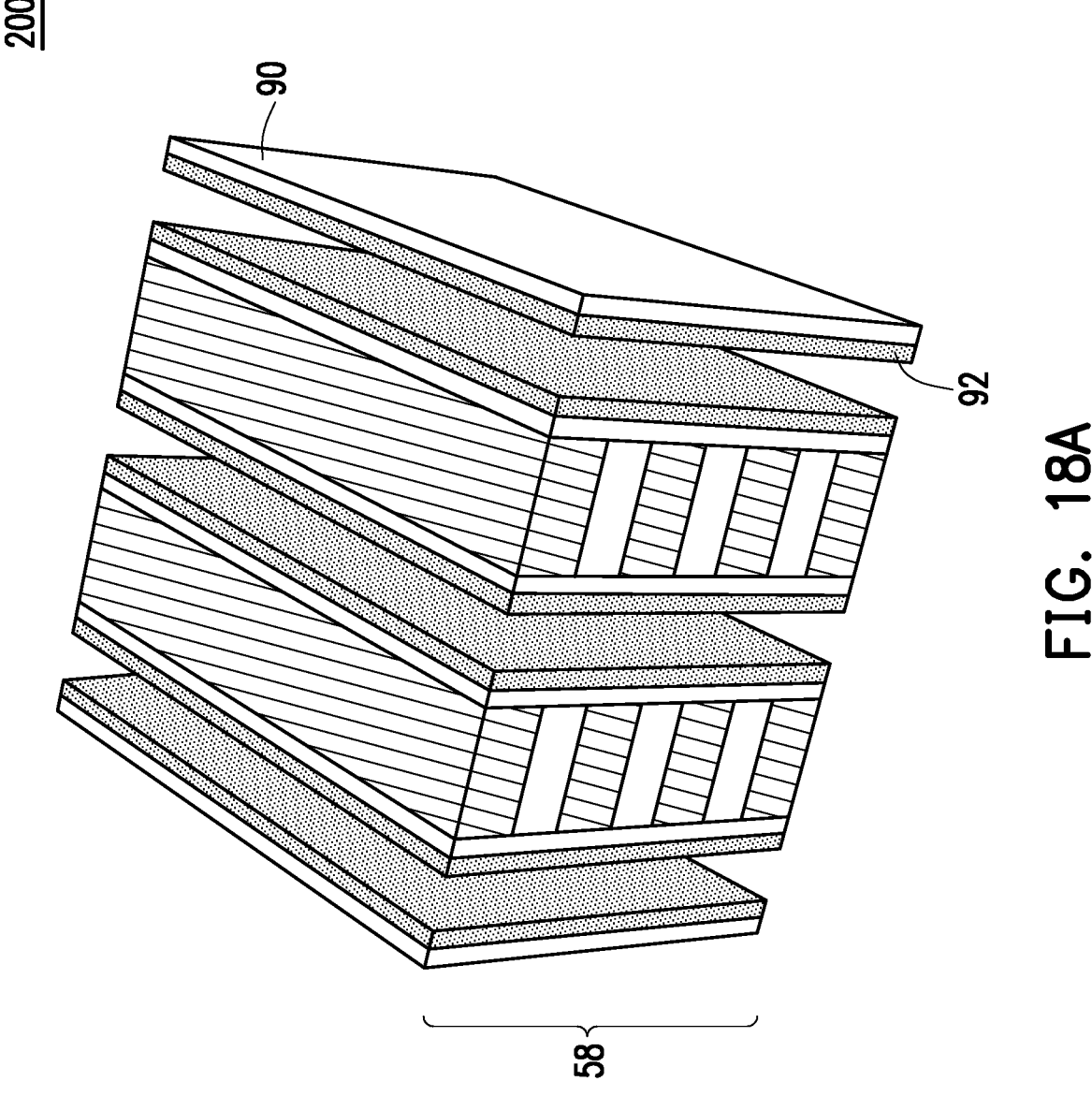
Figure 18B:

As illustrated in FIG. 18A and FIG. 18B, a channel layer 92 is conformally deposited in the trenches 86 over the dielectric layer 90. The channel layer 92 may be deposited by co-sputtering, CVD, PVD, ALD, PECVD, or the like. The channel layer 92 may extend along sidewalls and bottom surfaces of the trenches 86 over the dielectric layer 90. In some embodiments, the channel layer 92 may be further deposited on the IMD 70 and along the sidewall of each step of the staircase structure in the staircase region. The channel layer 92 may be a crystalline layer or an amorphous layer, the disclosure is not limited thereto.

In some embodiments, the channel layer 92 includes materials suitable for providing channel regions for the memory cells 202 (see FIG. 1A). For example, the channel layer 92 is free of gallium and zinc, and includes a material represented by formula 1:

$$In_xSn_yTi_zM_mO_n \qquad \text{[formula 1]}$$

wherein in formula 1, $0<x<1$, $0≤y<1$, $0<z<1$, $0<m<1$, $0<n<1$, and M represents at least one metal. In some embodiments, the metal M is at least one of Sc, V, Cr, Cu, Y, Nb, Ru, Ag and W.

In some further embodiments, the channel layer 92 is free of gallium and zinc, and includes a material represented by formula 2:

$$In_xTi_zM_mO_n \qquad \text{[formula 2]}$$

wherein in formula 2, $0<x<1$, $0<z<1$, $0<m<1$, $0<n<1$, and M represents at least one metal. In some embodiments, the metal M is at least one of Sc, V, Cr, Cu, Y, Nb, Ru, Ag and W.

By using the materials represented by formula 1 or formula 2 as the channel layer 92 to replace conventional indium gallium zinc oxide (IGZO) based oxide semiconductors, the fabrication costs may be reduced while high mobility and improved device stability may be provided. For example, the $SnO_2$, $In_2O_3$ and $TiO_2$ formed in the channel layer 92 can be used as the network former, mobility enhancer, and charge suppressor, while additional metal doping of the metal M is responsible for increment of carrier concentration. Furthermore, the $TiO_2$ in the channel layer 92 can be used as a charge suppressor, and is relatively inexpensive as compared to Ga.

In some embodiments, a sum of x, y and m (x+y+m) in formula 1 is greater than z. In other words, a sum of an atomic ratio of In, Sn and M is greater than an atomic ratio of Ti. In such embodiment, a carrier concentration of the channel layer 92 is high, the channel mobility is enhanced, while the electron trapping issue at the interface may be resolved. In some other embodiments, a sum of x, y and m (x+y+m) in formula 1 is smaller than z. In other words, a sum of an atomic ratio of In, Sn and M is smaller than an atomic ratio of Ti. In such embodiment, a carrier concentration of the channel layer 92 is low, a threshold voltage shift is greater than zero, and a negative bias stress (NBS) degradation issue may be resolved.

In some embodiments, the channel layer 92 is formed by PVD through direct current (DC) sputtering or radio frequency (RF) sputtering. For example, a thin film of the channel layer 92 is deposited on the dielectric layer 90 by DC sputtering under mixed Ar and $O_2$ environments using a single rotary $In_xSn_yTi_zM_mO_n$ target, whereby x, y, z, m and n have substantially equal atomic ratios (=0.25). In some embodiments, a thin film of the channel layer 92 is deposited on the dielectric layer 90 by RF sputtering of different atomic ratios of Ti, and the metal M, or alloys thereof, with $In_2O_3$ and/or $SnO_2$ targets.

For example, in one embodiment, metallic Ti and Sc targets are co-sputtered with $In_2O_3$ and $SnO_2$ targets under an Ar atmosphere to form a channel layer 92 comprising In—Sn—Ti—Sc—O. In another embodiment, metallic Ti and Cr (chromium) targets are co-sputtered with $In_2O_3$ under an Ar atmosphere to form a channel layer 92 comprising In—Ti—Cr—O. Although, Sc and Cr are used as examples of the metal M for sputtering, it is noted that the disclosure is not limited thereto, and all of the listed metal M may be applied in the above fabrication process. In some embodiments, the metal M includes two or more metals selected from Sc, V, Cr, Cu, Y, Nb, Ru, Ag and W. For example, when the metal M is Sc and Cu, a channel layer 92 comprising In—Sn—Ti—Sc—Cu—O may be formed. Furthermore, the reaction temperature of PVD is in a range from room temperature (25° C.) to 400° C., for example.

In some embodiments, the channel layer 92 is formed by CVD or ALD processes. For example, the number of $In_2O_3$, $SnO_2$, $TiO_2$ and MO (metal oxide) sequence cycles in CVD or ALD are adjusted to form the channel layer 92 having the desired atomic ratios. The indium oxide ($In_2O_3$), tin oxide ($SnO_2$), titanium oxide ($TiO_2$) and the metal oxide (MO) may be deposited using designated precursors. For instance, titanium oxide may be formed from a $TiCl_4$ precursor and $H_2O_2$, indium oxide may be formed from cyclopentadienyl indium precursor and ozone, and tin oxide may be formed from tetrakis(dimethylamino)tin and $H_2O$. However, the disclosure is not limited thereto, and other known precursors may be utilized to form the different metal oxides. Furthermore, the reaction temperature of CVD or ALD is in a range from 20° C. to 400° C., for example.

In some embodiments, after the co-sputtering, CVD, PVD, ALD or PECVD process to form the channel layer 92, a thermal annealing process may be optionally performed. For example, a thermal annealing process is performed on the channel layer 92 at a temperature of 200° C. to 400° C. to maintain the amorphous state. In some other embodiments, a thermal annealing process is performed on the channel layer 92 at a temperature of 1000° C. to 1600° C. to transform the channel layer 92 into a crystalline state. Furthermore, the thermal annealing process may be performed under various annealing ambiences, such as $N_2$, dry $O_2$, wet $O_2$, or the like.

Figure 19:

As illustrated in FIG. 19, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 20:
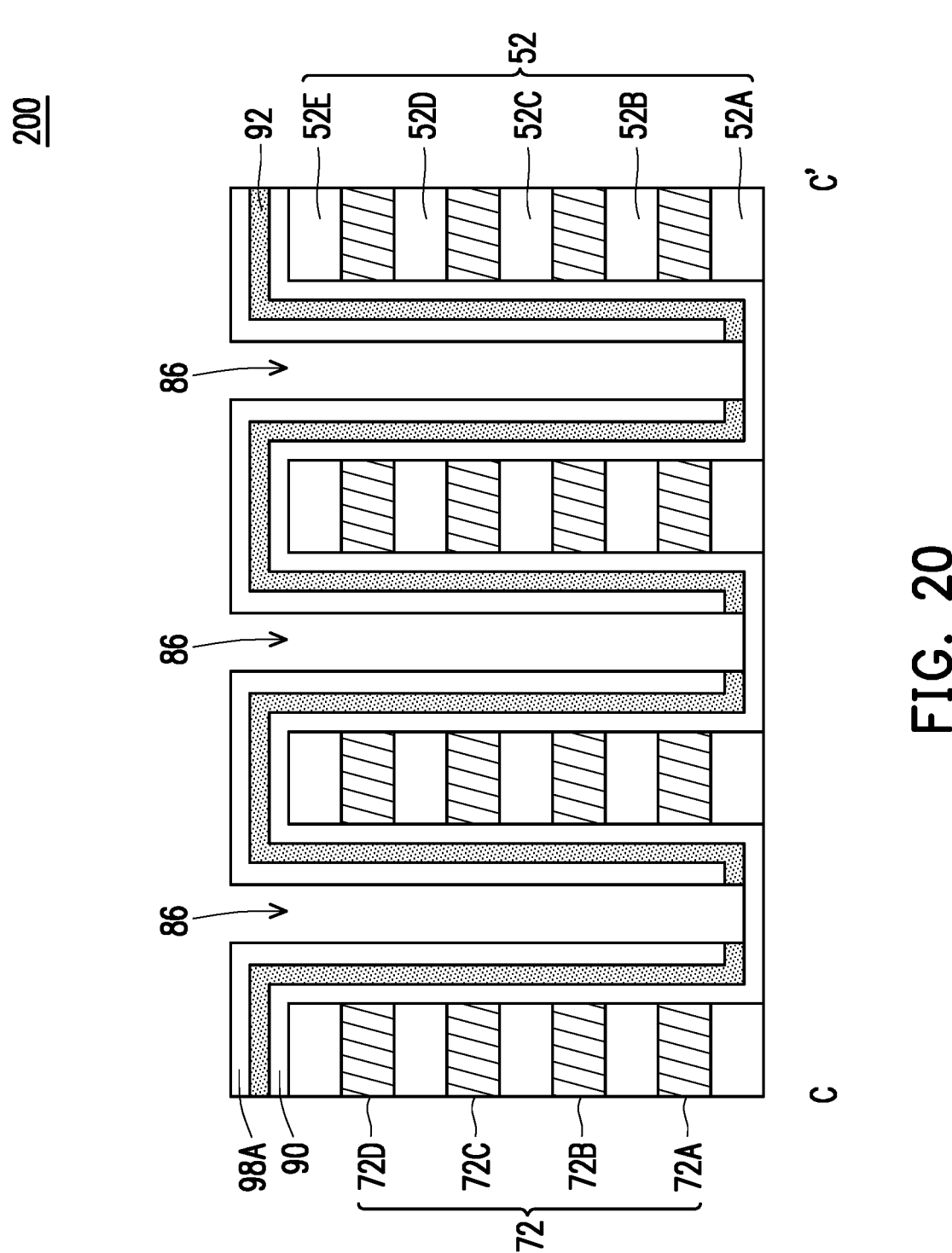

As illustrated in FIG. 20, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. Accordingly, the remaining dielectric material 98A and the channel layer 92 may expose portions of the dielectric layer 90 on bottom surfaces of the trenches 86. Thus, portions of the channel layer 92 on opposing sidewalls of the trenches 86 may be separated from each other, which improves isolation between the memory cells 202 of the memory device 200 (see FIG. 1A).

Figure 21:
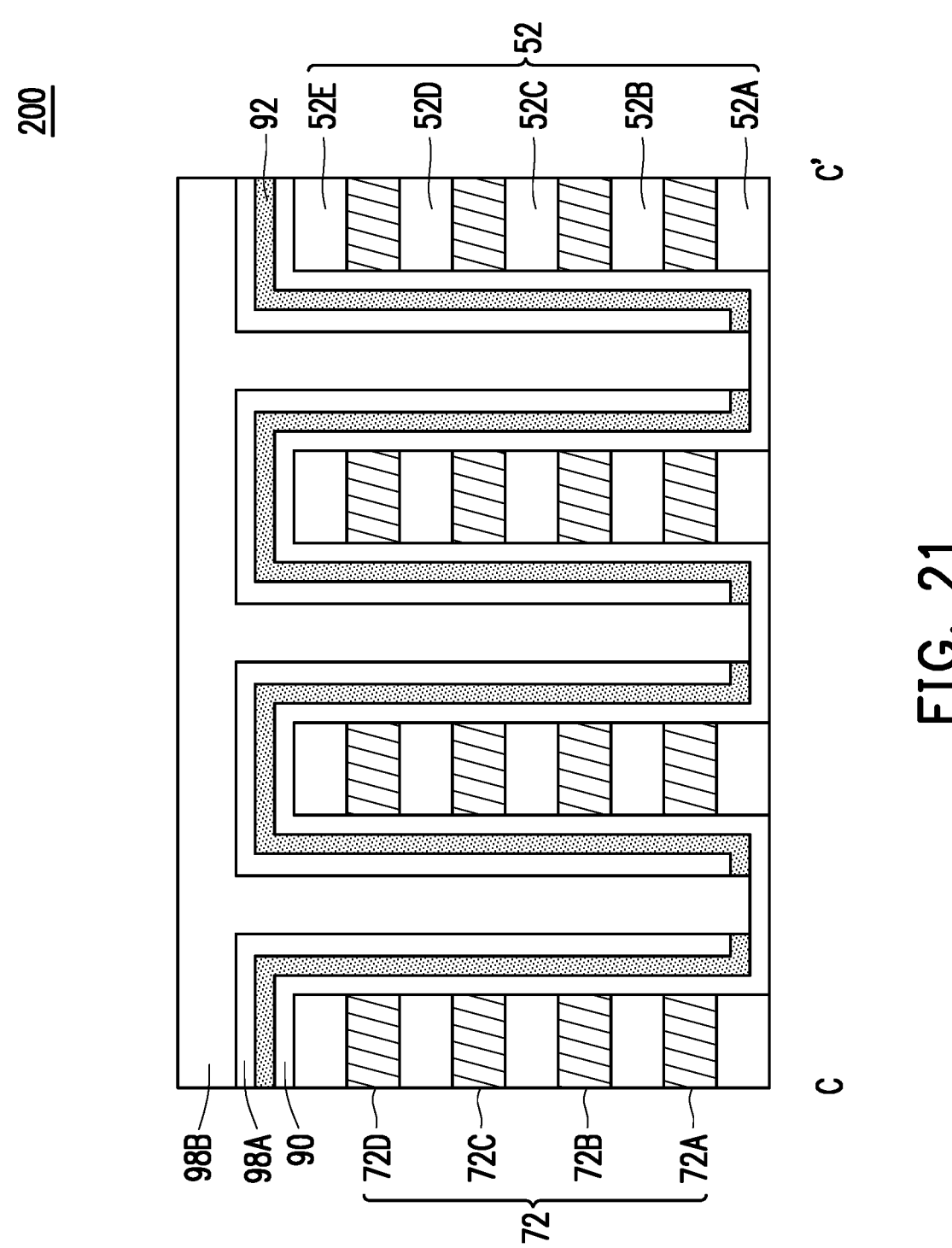

As illustrated in FIG. 21, a dielectric material 98B is deposited to completely fill the trenches 86. The dielectric material 98B may be formed of one or more materials and by processes the same as or similar to those of the dielectric material 98A. In some alternative embodiments, the dielectric material 98B and the dielectric material 98A include different materials.

Figure 22A:
Figure 22B:

As illustrated in FIG. 22A and FIG. 22B, a removal process is applied to the dielectric materials 98A/98B, the channel layer 92, and the dielectric layer 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the dielectric layer 90, the channel layer 92, the dielectric materials 98A/98B, and the IMD 70 (in the staircase region) are leveled after the planarization process is completed.

Figure 24A:
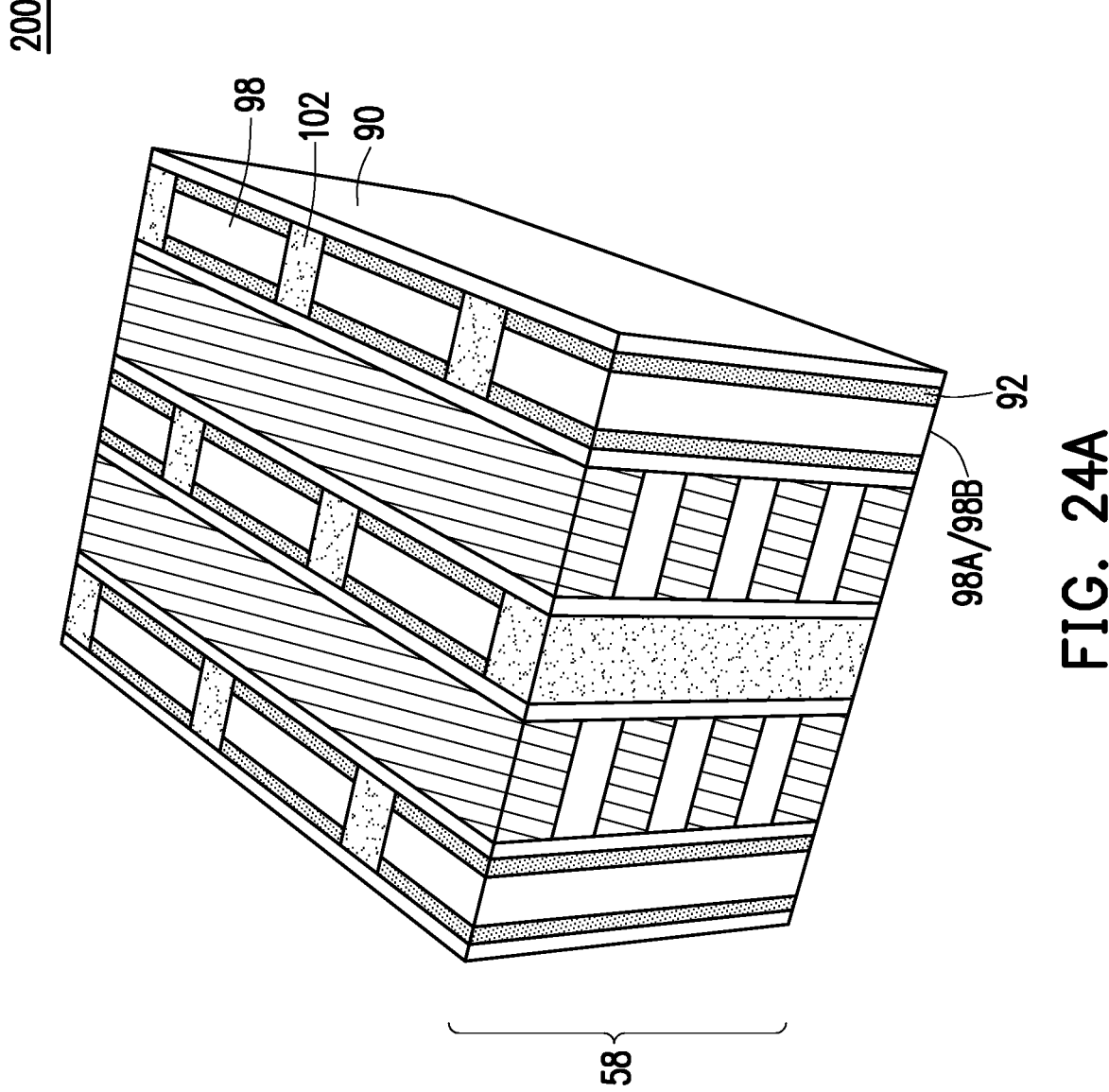
Figure 24B:
Figure 25A:
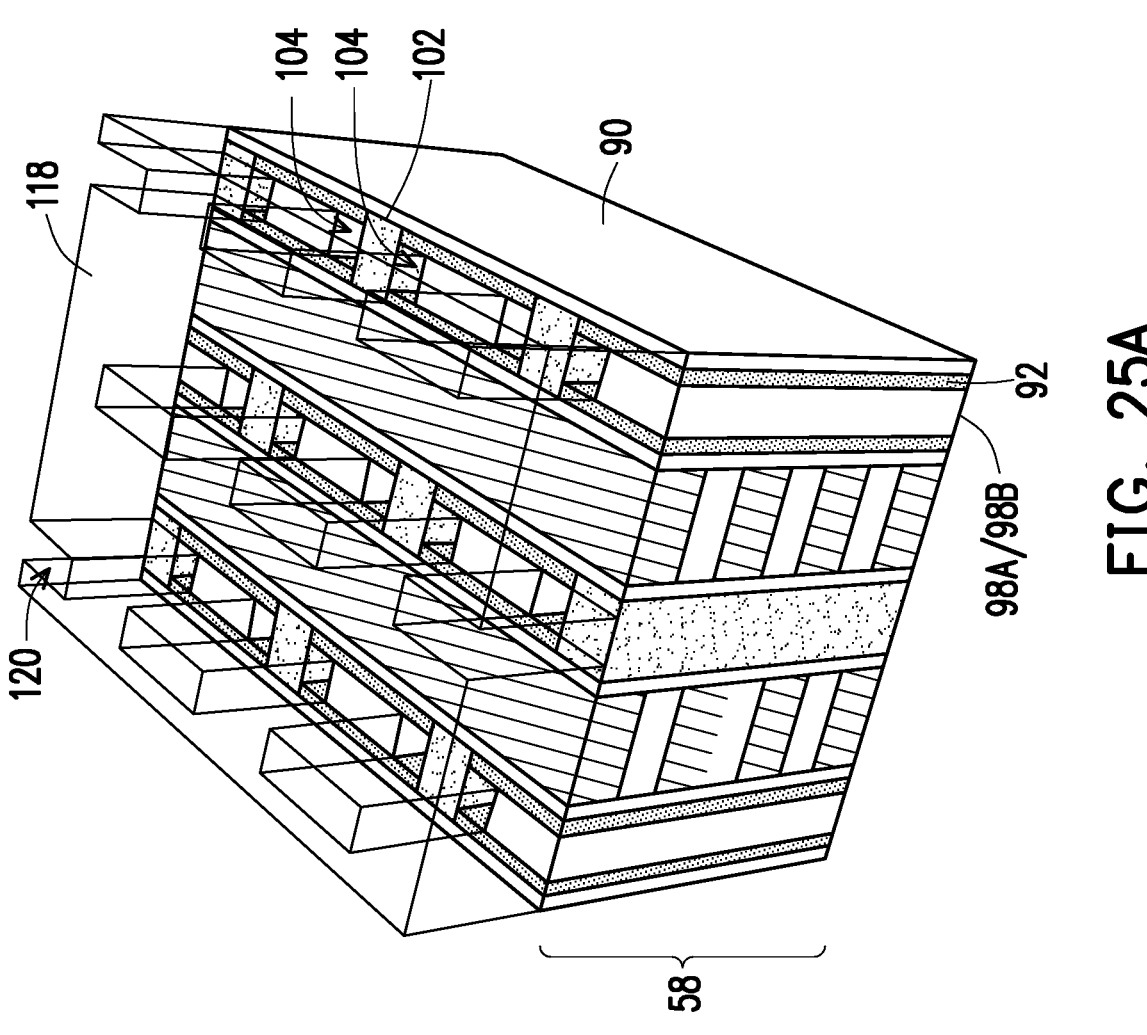
Figure 25B:
Figure 26A:
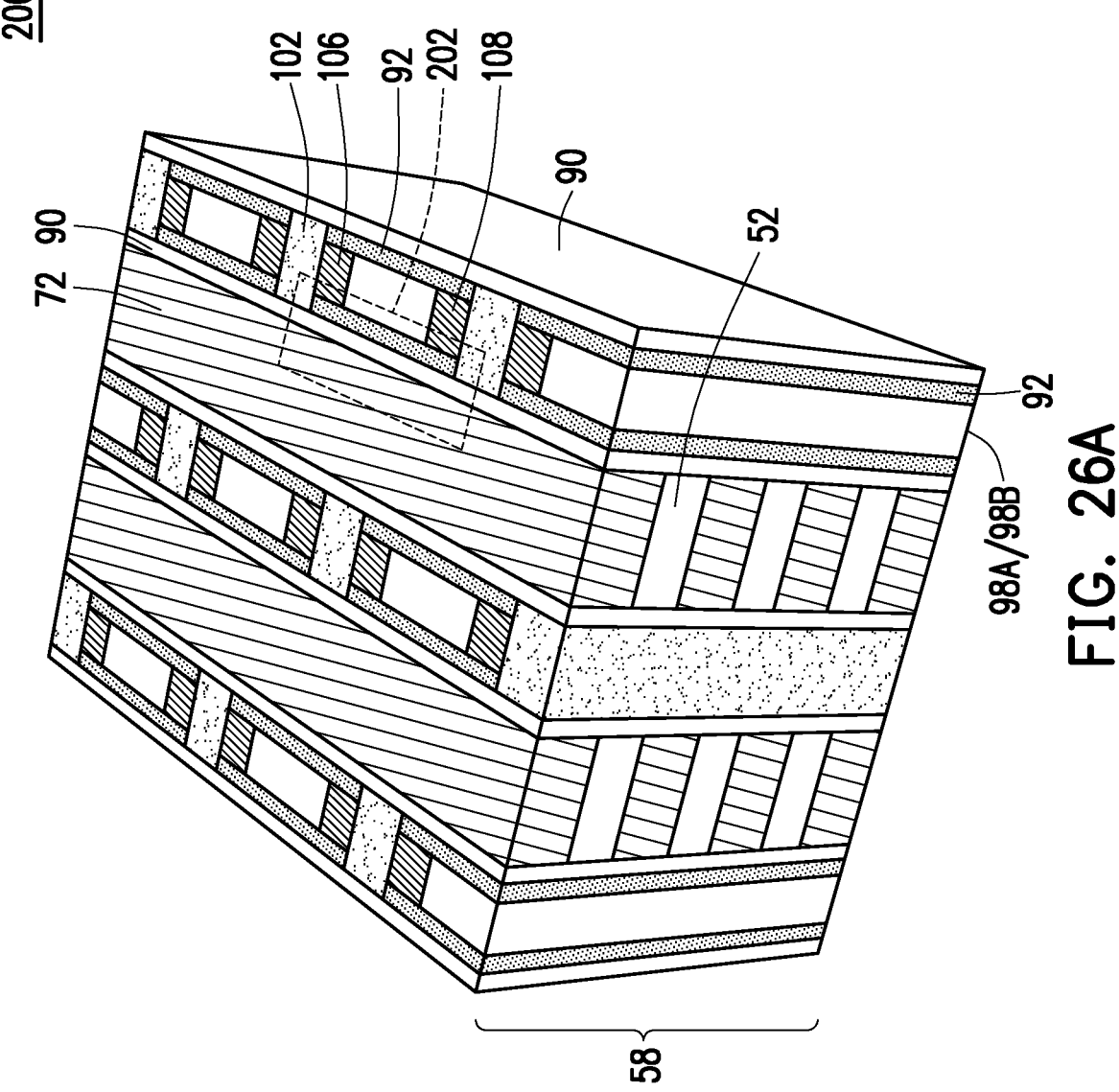
Figure 26B:

FIG. 23A through FIG. 26B illustrate intermediate steps of manufacturing conductive pillars 106 and 108 (e.g., source/drain pillars) in the memory device 200. The conductive pillars 106 and 108 may extend along a direction perpendicular to the conductive lines 72 such that individual cells of the memory device 200 may be selected for read and write operations. FIGS. 23A, 24A, 25A and 26A are illustrated in a partial three-dimensional view. In FIGS. 23B and 24B, cross-sectional views are provided along line C-C' of FIG. 1A. In FIGS. 25B and 26B, cross-sectional views are provided along line D-D' of FIG. 1A.

Figure 23A:
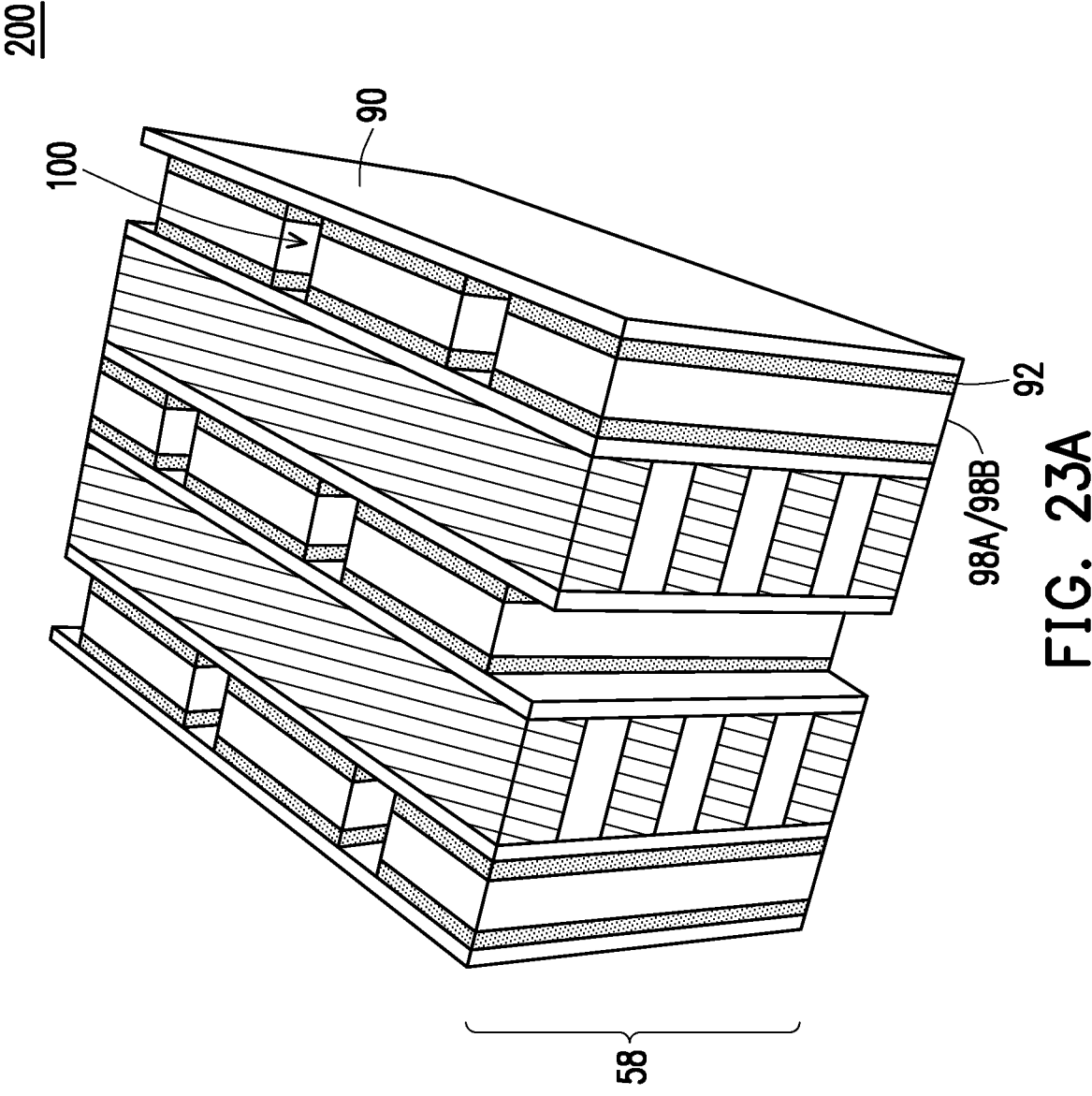
Figure 23B:
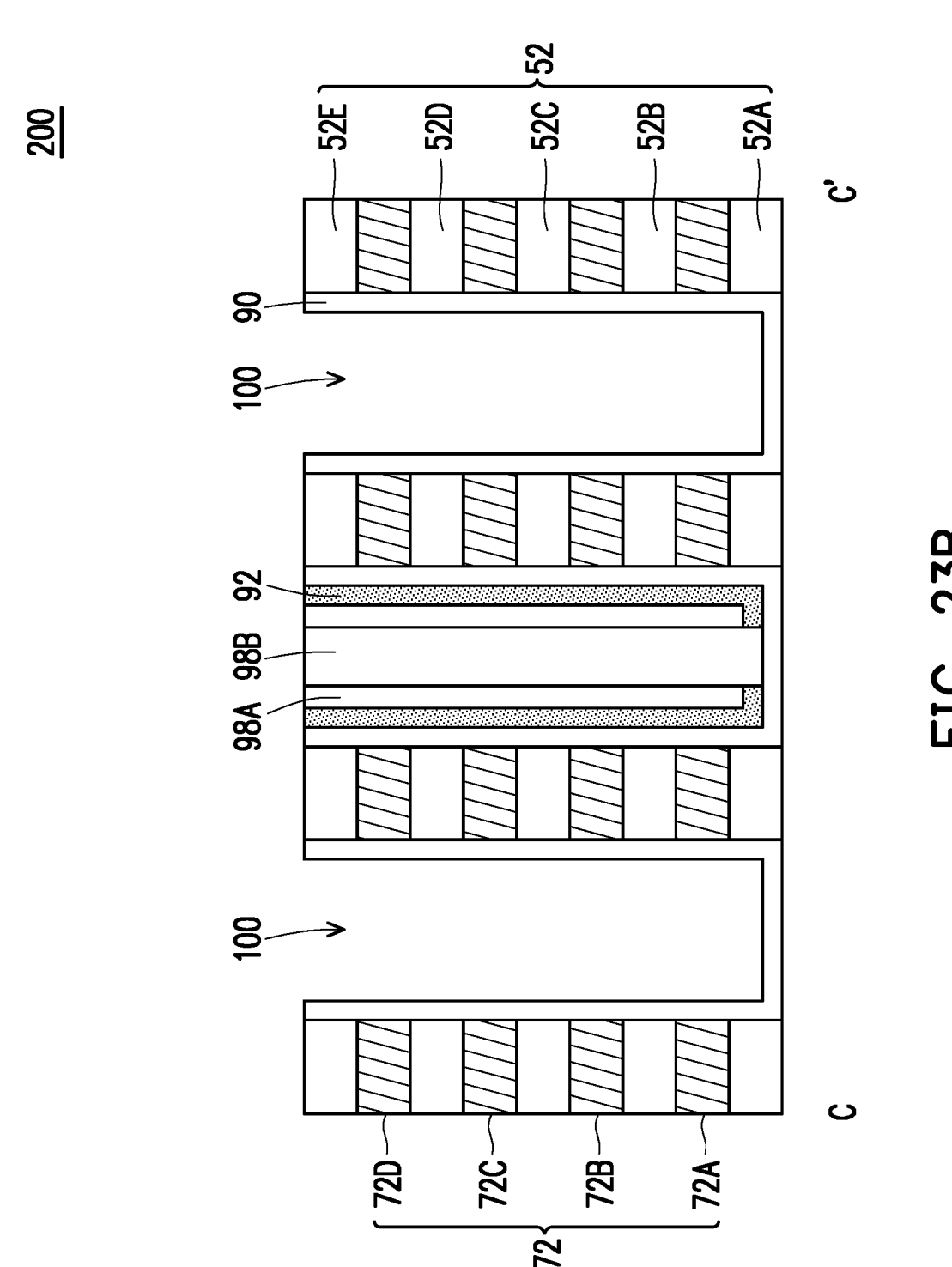

As illustrated in FIGS. 23A and 23B, trenches 100 are patterned through the channel layer 92 and the dielectric materials 98A/98B. For example, the dielectric materials 98A/98B are patterned to form dielectric pillars separated by the trenches 100. Patterning the trenches 100 may be performed through a combination of photolithography and etching, for example. The trenches 100 may be disposed between opposing sidewalls of the dielectric layer 90, and the trenches 100 may physically separate adjacent stacks of memory cells in the memory device 200 (see FIG. 1A).

As illustrated in FIGS. 24A and 24B, isolation pillars 102 are formed in the trenches 100. In some embodiments, an isolation layer is deposited over the multi-stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer to form the isolation pillars 102. In the resulting structure, top surfaces of the multi-layer stack 58 (e.g., dielectric layer 52E), the dielectric layer 90, the channel layer 92, and the isolation pillars 102 may be substantially leveled (e.g., within process variations). In some embodiments, materials of the dielectric materials 98A/98B and isolation pillars 102 may be selected so that they may be etched selectively relative to each other. For example, in some embodiments, the dielectric materials 98A/98B include oxide and the isolation pillars 102 include nitride. In some embodiments, the dielectric materials 98A/98B (or dielectric pillars) include nitride and the isolation pillars 102 include oxide. Other materials are also possible.

As illustrated in FIG. 25A and FIG. 25B, trenches 104 are defined for the subsequently formed conductive pillars 106 and 108. For example, the dielectric materials 98A/98B (or dielectric pillars) are further patterned to define the trenches 104. The trenches 104 are formed by patterning the dielectric materials 98A/98B (or dielectric pillars) with a combination of photolithography and etching, for example. In some embodiments, as shown in FIG. 25A, a photoresist 118 is formed over the multi-layer stack 58, the dielectric materials 98A/98B, the isolation pillars 102, the channel layer 92, and the dielectric layer 90. In some embodiments, the photoresist 118 is patterned by an acceptable photolithography technique to define openings 120. Each of the openings 120 may expose the corresponding isolation pillar 102 and two separate regions of the dielectric materials 98A/98B beside the isolation pillar 102. In this way, each of the openings 120 may define a pattern of a conductive pillar 106 and an adjacent conductive pillar 108 that are separated by the isolation pillars 102.

Subsequently, portions of the dielectric materials 98A/98B (or dielectric pillars) exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric materials 98A/98B without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 26A and 26B). After the trenches 104 are patterned, the photoresist 118 may be removed by ashing, for example.

As illustrated in FIG. 26A and FIG. 26B, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the dielectric layer 90, the channel layer 92, the conductive pillars 106, and the conductive pillars 108 may be substantially leveled (e.g., within process variations). In some embodiments, the conductive pillars 106 correspond to and are electrically connected to the bit lines in the memory device 200, and the conductive pillars 108 correspond to and are electrically connected to the source lines in the memory device 200.

Thus, stacked memory cells 202 may be formed in the memory device 200, as shown in FIG. 26A. Each memory cell 202 includes a gate electrode (e.g., a portion of a corresponding conductive line 72), a gate dielectric (e.g., a portion of a corresponding dielectric layer 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 27A:
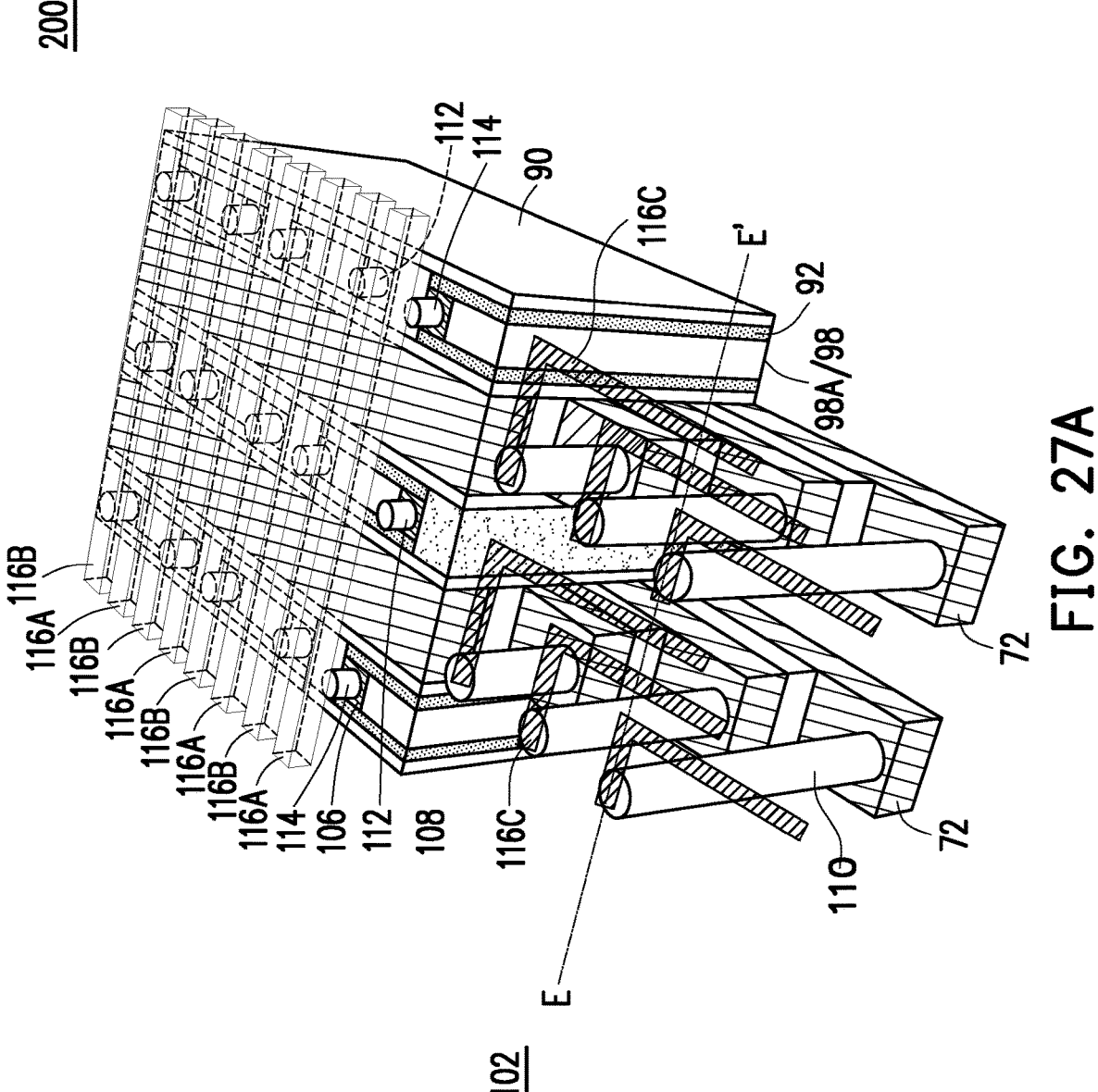
Figure 27B:
Figure 27C:
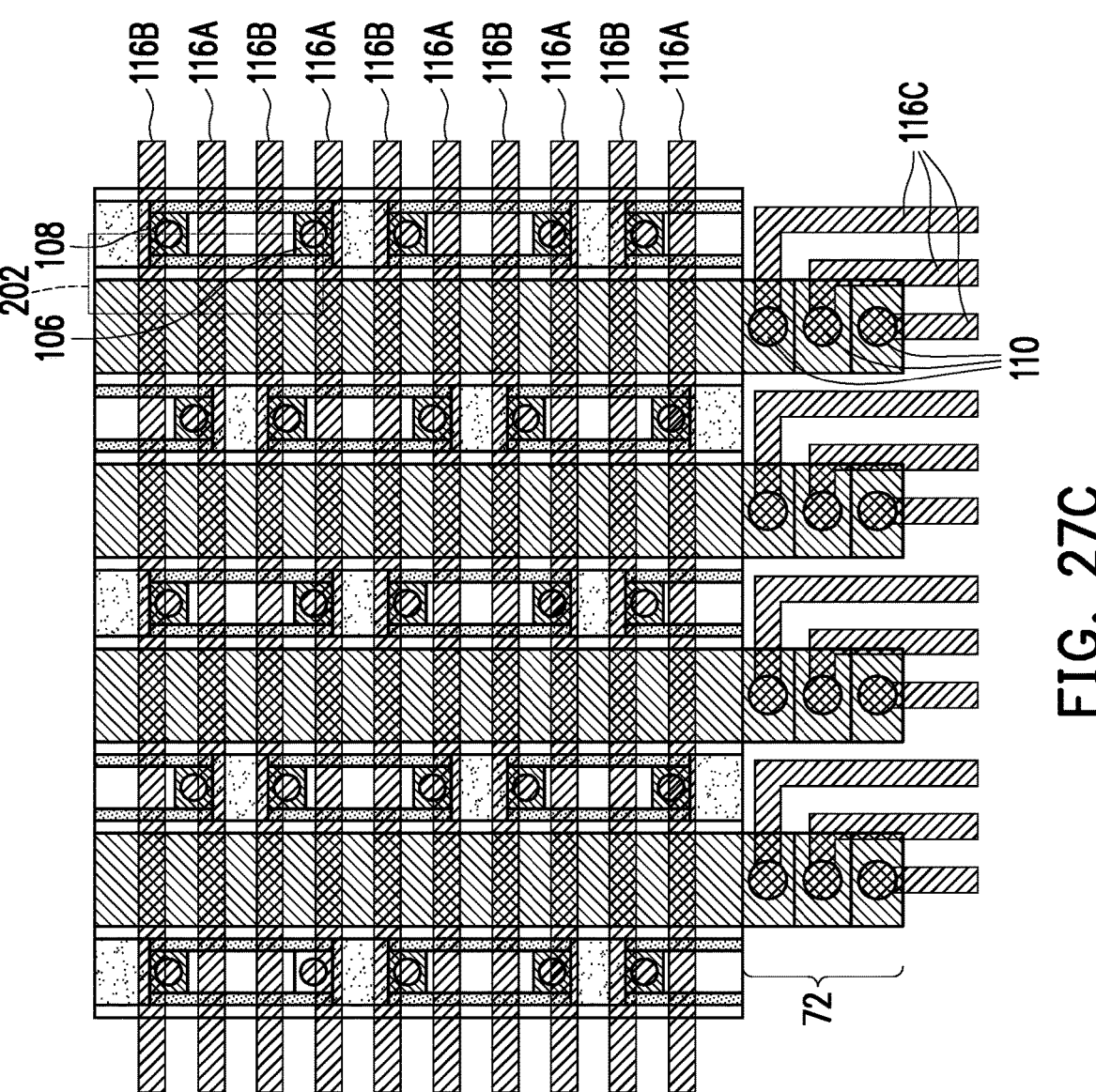
Figure 27D:
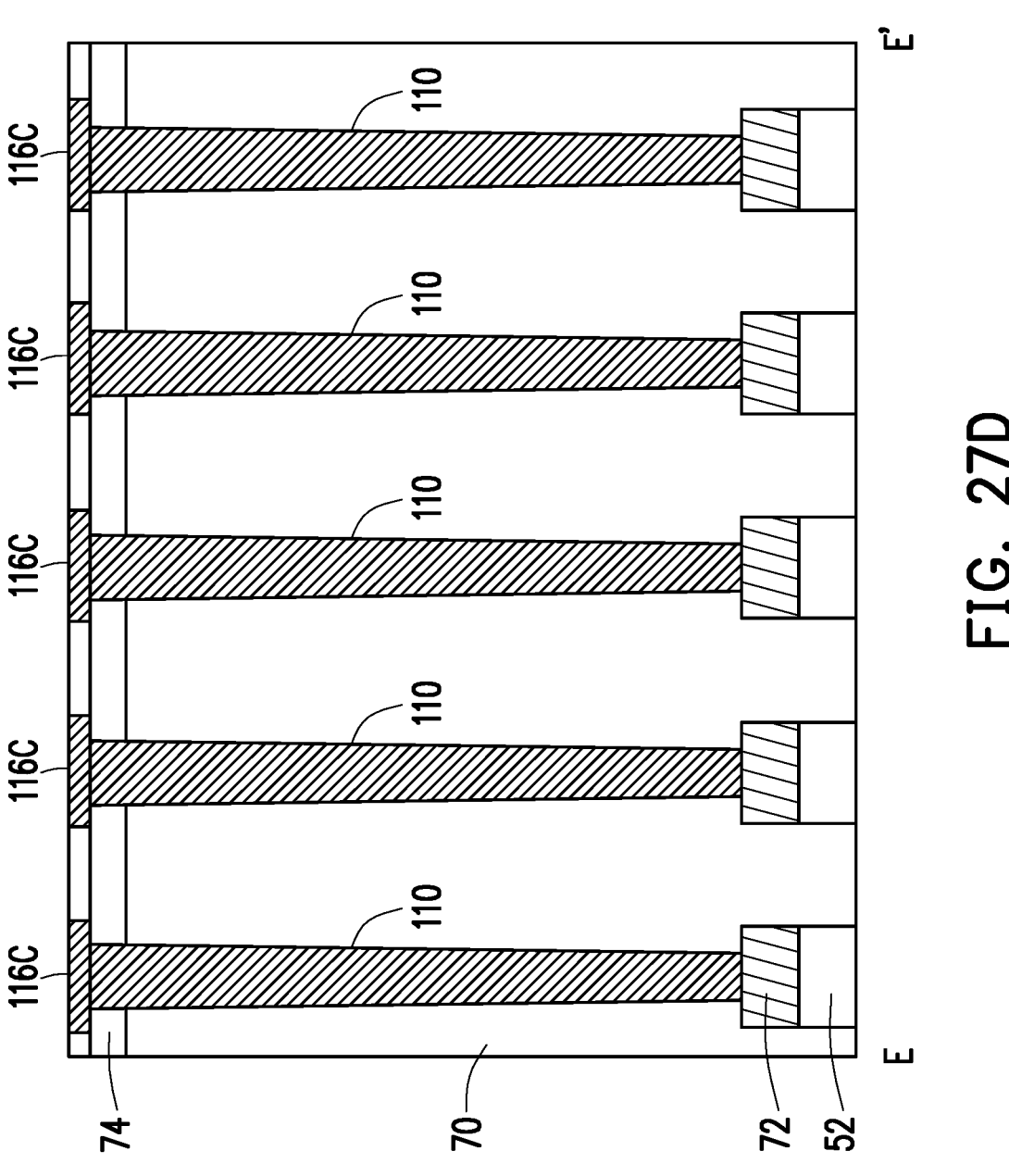
Figure 27E:
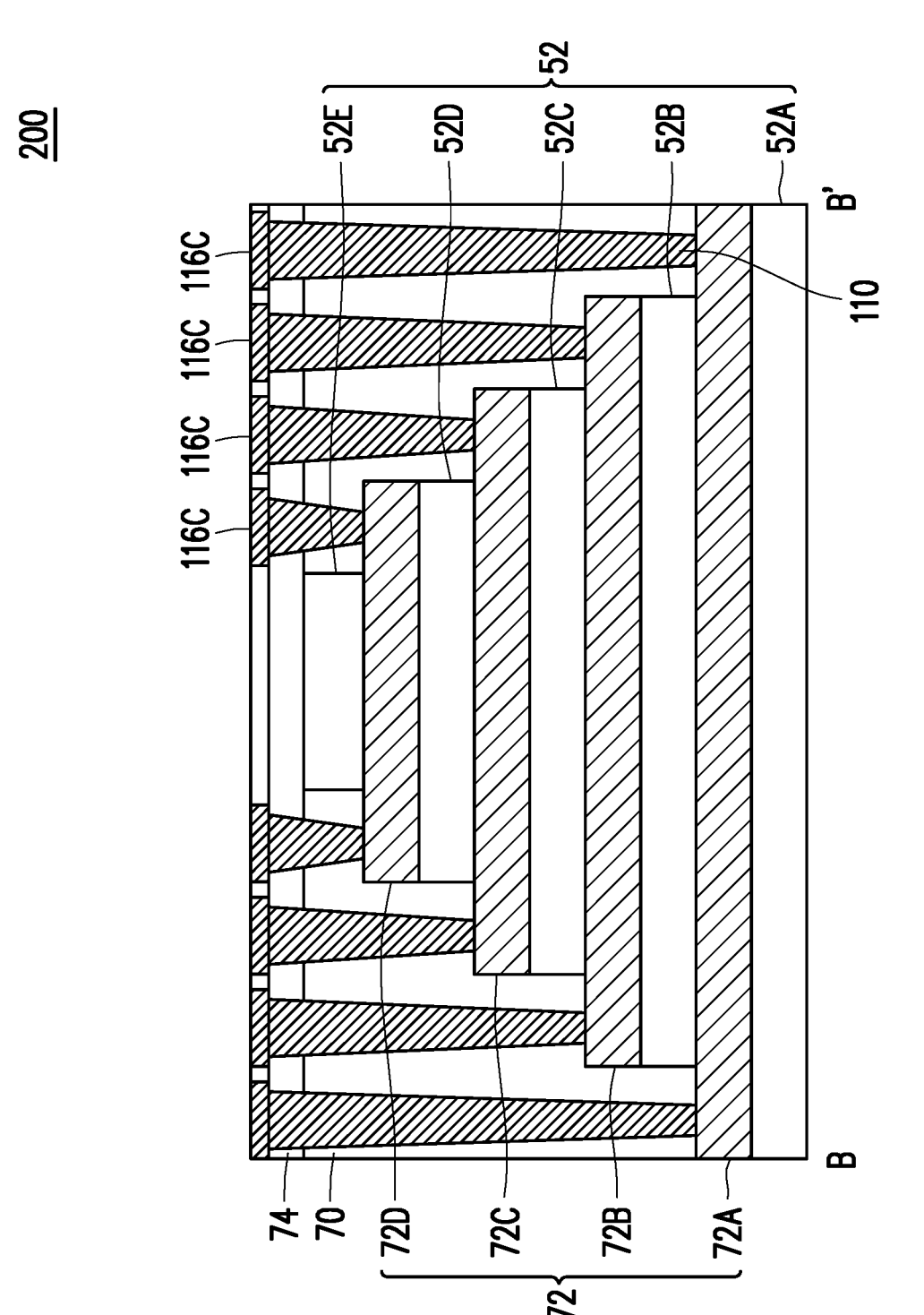

As illustrated in FIG. 27A to FIG. 27E, an IMD layer 74 is formed on top surfaces of the multi-layer stack 58 (e.g., the dielectric layer 52E), the dielectric layer 90, the channel layer 92, the conductive pillars 106, and the conductive pillars 108 and the IMD 70 (in the staircase region). Conductive contacts 110, 112, and 114 are made on the conductive lines 72, the conductive pillars 106, and the conductive pillars 108, respectively. FIG. 27A illustrates a perspective view of the memory device 200; FIG. 27B illustrates a cross-sectional view of the device along line D-D' of FIG. 1A; FIG. 27C illustrates a top-down view of the memory device 200; and FIG. 27D illustrates a cross-sectional view along the line E-E' of FIG. 27A; and FIG. 27E illustrates a cross-sectional view of the device along line B-B' of FIG. 1A.

The IMD 74 may be formed of a dielectric material, and may be deposited by any suitable method, such as CVD, PECVD, flowable CVD (FCVD), or the like. The dielectric materials may include phospho-silicate glass (PSG), borosilicate glass (BSG), boron-doped phospho-silicate glass (BPSG), undoped silicate glass (USG), or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58. In some embodiments, the removal process may be a planarization process, such as a chemical mechanical polish (CMP), an etch-back process, combinations thereof, or the like.

In some embodiments, the staircase shape of the conductive lines 72 may provide a surface on each of the conductive lines 72 for the conductive contacts 110 to land on. In some embodiments, forming the contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the contacts 110 in the openings.

As also illustrated by the perspective view of FIG. 27A, conductive contacts 112 and 114 may also be made on the conductive pillars 106 and the conductive pillars 108, respectively. The conductive contacts 112, 114 and 110 may be electrically connected to conductive lines 116A, 116B, and 116C, respectively, which connect the memory device to an underlying/overlying circuitry (e.g., control circuitry) and/or signal, power, and ground lines in the semiconductor die. For example, as shown in FIG. 27D, the conductive contacts 110 may extend through the IMD 74 and IMD 70 to electrically connect conductive lines 116C to the conductive lines 72 and the underlying active devices on the substrate. Other conductive contacts or vias may be formed through the IMD 74 to electrically connect the conductive lines 116A and 116B to the underlying active devices on the substrate. In alternate embodiments, routing and/or power lines to and from the memory device may be provided by an interconnect structure formed over the memory device 200 in addition to or in lieu of the interconnect structure 320 (FIG. 2). Accordingly, the memory device 200 may be completed.

Figure 28:
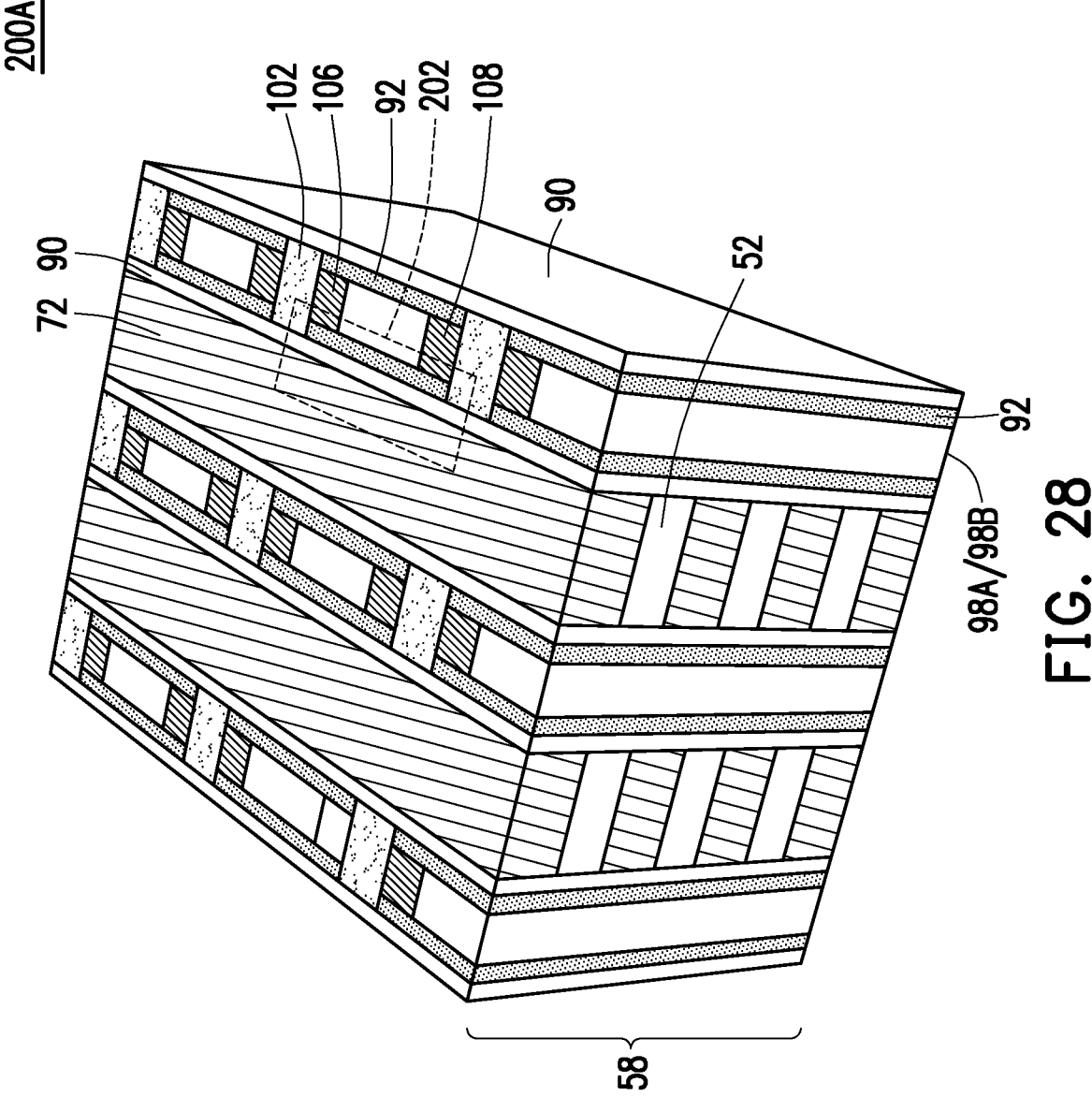
FIG. 28 illustrates a simplified perspective view of a memory device in accordance with some other embodiments of the disclosure.

FIG. 28 illustrates a simplified perspective view of a memory device in accordance with some other embodiments of the disclosure. The memory device 200A shown in FIG. 28 is similar to the memory device 200 shown in FIG. 26A. Therefore, the same reference numerals are used to refer to the same or liked parts, and its detailed description will be omitted herein.

Although the embodiments of FIG. 1A through FIG. 26B illustrate a particular pattern for the conductive pillars 106 and 108, other configurations are also possible. For example, in these embodiments, the conductive pillars 106 and 108 have a staggered pattern. However, in the memory device 200A shown in FIG. 28, the conductive pillars 106 and 108 in a same row of the array are all aligned with each other. Furthermore, although the memory device 200 illustrated in FIG. 26A shows that the dielectric pillars (e.g., dielectric materials 98A/98B) are arranged in a staggered arrangement, however, the disclosure is not limited thereto. In some embodiments, in the memory device 200A shown in FIG. 28, the dielectric pillars (e.g., dielectric materials 98A/98B) of adjacent columns are arranged in a regular array and aligned to each other.

Figure 29:
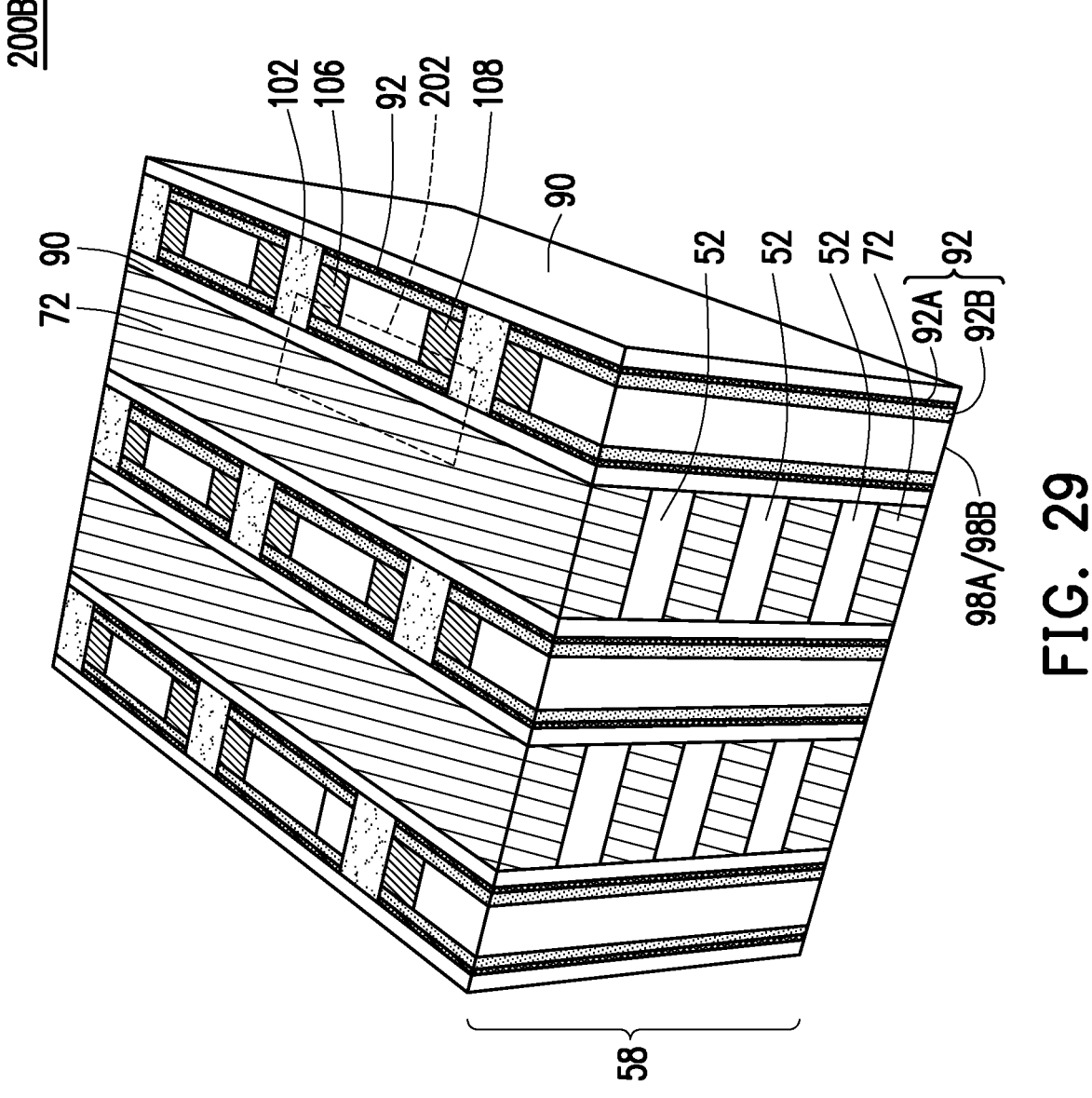
FIG. 29 illustrates a simplified perspective view of a memory device in accordance with some other embodiments of the disclosure.

FIG. 29 illustrates a simplified perspective view of a memory device in accordance with some other embodiments of the disclosure. The memory device 200B shown in FIG. 29 is similar to the memory device 200 shown in FIG. 26A. Therefore, the same reference numerals are used to refer to the same or liked parts, and its detailed description will be omitted herein.

As illustrated in the previous embodiments, the channel layer 92 is a single layer with a single composition (e.g. the material represented by formula 1). However, the disclosure is not limited thereto. As illustrated in FIG. 29, in some embodiments, the channel layer 92 of the memory device 200B includes a first sub-layer 92A and a second sub-layer 92B. The first sub-layer 92A is in contact with the dielectric layer 90, while the second sub-layer 92B is in contact with the plurality of dielectric pillars (e.g., dielectric materials 98A/98B). In some embodiments, the first sub-layer 92A and the second sub-layer 92B both include the material represented by formula 1 ($In_xSn_yTi_zM_mO_n$) or formula 2 ($In_xTi_zM_mO_n$) above. However, the first sub-layer 92A and the second sub-layer 92B have different compositional ratio of the material represented by formula 1 or formula 2. In some embodiments, one of the first sub-layer 92A and the second sub-layer 92B includes the material represented by formula 1, while the other one of the first sub-layer 92A and the second sub-layer 92B includes the material represented by formula 2. In some embodiments, the first sub-layer 92A and the second sub-layer 92B have different carrier concentration due to their difference in the compositional ratio of materials.

In some embodiments, the first sub-layer 92A is a crystalline layer and the second sub-layer 92B is an amorphous layer. However, the disclosure is not limited thereto. In alternative embodiments, the first sub-layer 92A is an amorphous layer and the second sub-layer 92B is a crystalline layer. In some other embodiments, both of the first sub-layer 92A and the second sub-layer 92B are crystalline layers, or both of the first sub-layer 92A and the second sub-layer 92B are amorphous layers. In some embodiments, when one of the first sub-layer 92A and the second sub-layer 92B includes a crystalline layer while the other one includes an amorphous layer, an interface will exist between the first sub-layer 92A and the second sub-layer 92B.

In some embodiments, the thicknesses of the first sub-layer 92A and the second sub-layer 92B is not particularly limited. For example, as illustrated in FIG. 29, a thickness of the second sub-layer 92B is greater than a thickness of the first sub-layer 92A. In some alternative embodiments, the thickness of the second sub-layer 92B is smaller than a thickness of the first sub-layer 92A, or the first sub-layer 92A and the second sub-layer 92B have substantially the same thickness. The thicknesses of the first sub-layer 92A and the second sub-layer 92B may be appropriately controlled based on design requirements, and may be altered based on their compositional differences.

In one exemplary embodiment, the first sub-layer 92A and the second sub-layer 92B are formed by two separate deposition processes through PVD. For example, the first sub-layer 92A is formed on the dielectric layer 90 by co-sputtering at high temperatures under an Ar atmosphere, and thermal annealing is performed at 1000° C. to 1600° C. Thereafter, the second sub-layer 92B is formed on the first sub-layer 92A by co-sputtering at lower temperatures under mixed Ar and $O_2$ environment, and thermal annealing is performed at 200° C. to 400° C. It is noted that the formation of the first sub-layer 92A and the second sub-layer 92B is not limited to the above examples. For example, the first sub-layer 92A and the second sub-layer 92B may be individually formed by co-sputtering, CVD, PVD, ALD or PECVD, or the like, and may be formed in the same way as described for the channel layer 92 in FIG. 18A and FIG. 18B.

In the above-mentioned embodiments, by using a material represented by formula 1 ($In_xSn_yTi_zM_mO_n$) or formula 2 ($In_xTi_zM_mO_n$) as the channel layer (or oxide semiconductor) to replace conventional IGZO-based oxide semiconductors, the fabrication costs may be significantly reduced, while high mobility and device stability may be provided. For example, the $SnO_2$, $In_2O_3$ and $TiO_2$ formed in the channel layer can be used as the network former, mobility enhancer, and charge suppressor, while additional metal doping of the metal M is responsible for increment of carrier concentration. Furthermore, the $TiO_2$ in the channel layer 92 can be used as a charge suppressor, and is relatively inexpensive as compared to Ga. By using a Ga and Zn free metal oxide as the channel material, the problems and defects observed in conventional IGZO-based oxide semiconductors may be resolved.

In accordance with some embodiments of the present disclosure, a device includes a dielectric layer, a conductive layer, electrode layers and an oxide semiconductor layer. The dielectric layer has a first surface and a second surface opposite to the first surface. The conductive layer is disposed on the first surface of the dielectric layer. The electrode layers are disposed on the second surface of the dielectric layer. The oxide semiconductor layer is disposed in between the second surface of the dielectric layer and the electrode layers, wherein the oxide semiconductor layer comprises a material represented by formula 1 ($In_xSn_yTi_zM_mO_n$). In formula 1, 1, $0 < x < 1$, $0 \leq y < 1$, $0 < z < 1$, $0 < m < 1$, $0 < n < 1$, and M represents at least one metal.

In accordance with some other embodiments of the present disclosure, a memory device includes a multi-layer stack, a plurality of dielectric pillars, a channel layer and a ferroelectric layer. The multi-layer stack is disposed on a substrate and comprises a plurality of conductive layers and a plurality of dielectric layers alternately stacked. The plurality of dielectric pillars is disposed on the substrate and penetrating through the multi-layer stack. The channel layer is located on side surfaces of the plurality of dielectric pillars, wherein the channel layer comprises a material represented by formula 1 ($In_xSn_yTi_zM_mO_n$). In formula 1, 1, $0 < x < 1$, $0 \leq y < 1$, $0 < z < 1$, $0 < m < 1$, $0 < n < 1$, and M represents at least one metal. The ferroelectric layer is disposed between the channel layer and each of the plurality of conductive layers and the plurality of dielectric layers.

In accordance with yet another embodiment of the present disclosure, a method of forming a memory device is described. The method includes the following steps. A multi-layer stack is formed on a substrate, wherein the multi-layer stack comprises a plurality of dielectric layers and a plurality of conductive layers stacked alternately and has a trench penetrating therethrough. A ferroelectric layer is formed on sidewalls of the trench, wherein the ferroelectric layer covers sidewalls of the plurality of dielectric layers and the plurality of conductive layers. A channel layer is formed on the ferroelectric layer, wherein the channel layer comprises a material represented by formula 1 ($In_xSn_yTi_zM_mO_n$). In formula 1, 1, $0<x<1$, $0\leq y<1$, $0<z<1$, $0<m<1$, $0<n<1$, and M represents at least one metal. A plurality of dielectric pillars is formed to penetrate through the multi-layer stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, comprising:
forming a plurality of conductive lines;
forming a dielectric layer on the plurality of conductive lines;
forming a first sub-channel layer on the dielectric layer, wherein the first sub-channel layer is a gallium and zinc free layer;
forming a second sub-channel layer on the first sub-channel layer, wherein the second sub-channel layer is a gallium and zinc free layer, and a compositional ratio of a material of the first sub-channel layer is different from a composition ratio of a material of the second sub-channel layer;
forming a plurality of electrode layers on the second sub-channel layer, wherein the first sub-channel layer is formed of a material represented by formula 1, and the second sub-channel layer is formed of a material represented by formula 2:

$$In_xSn_yTi_zM_mO_n \qquad \text{[formula 1]}$$

wherein in formula 1, $0<x<1$, $0\leq y<1$, $0<z<1$, $0<m<1$, $0<n<1$, and M represents at least one metal; and $$In_xTi_zM_mO_n \qquad \text{[formula 2]}$$

wherein in formula 2, $0<x<1$, $0<z<1$, $0<m<1$, $0<n<1$, and M represents at least one metal.

2. The method according to claim 1, wherein a sum of x, y and m (x+y+m) in formula 1 is smaller than z.

3. The method according to claim 1, wherein in formula 1 and formula 2, the metal M is at least one of Sc, V, Cr, Cu, Y, Nb, Ru, Ag and W.

4. The method according to claim 1, wherein after forming the first sub-channel layer by co-sputtering, a thermal annealing process is performed on the first sub-channel layer at a temperature of 1000° C. to 1600° C. to transform the first sub-channel into a crystalline state.

5. The method according to claim 1, wherein after forming the second sub-channel layer by co-sputtering, a thermal annealing process is performed on the second sub-channel layer at a temperature of 200° C. to 400° C. to maintain an amorphous state of the second sub-channel layer.

6. The method according to claim 1, wherein forming the plurality of electrode layers comprises:
forming a dielectric material over the second sub-channel layer;
patterning the dielectric material to form trenches that reveal sidewalls of the second sub-channel layer; and
forming the plurality of electrode layers in the trenches over the sidewalls of the second sub-channel layer.

7. The method according to claim 1, further comprising forming an isolation structure over the dielectric layer, wherein the isolation structure separates two adjacent electrode layers of the plurality of electrode layers.

8. A method of forming a device, comprising:
forming an interconnection structure over a substrate;
forming a multilayer stack over the interconnection structure;
patterning the multilayer stack to form trenches;
conformally forming an oxide semiconductor layer in the trenches, wherein the oxide semiconductor layer is formed by depositing a material represented by formula 1:

$$In_xSn_yTi_zM_mO_n \qquad \text{[formula 1]}$$

wherein in formula 1, $0<x<1$, $0\leq y<1$, $0<z<1$, $0<m<1$, $0<n<1$, and M represents at least one metal;
forming a dielectric material over the oxide semiconductor layer to fill the trenches;
patterning the dielectric material to form second trenches in the dielectric material; and
forming conductive pillars in the second trenches, wherein the conductive pillars are in contact with the oxide semiconductor layer.

9. The method according to claim 8, wherein the oxide semiconductor layer is formed by physical vapor deposition by co-sputtering Ti and Sc targets with $In_2O_3$ and $SnO_2$ targets under an argon atmosphere to form In—Sn—Ti—Sc—O as the oxide semiconductor layer.

10. The method according to claim 8, wherein the oxide semiconductor layer is formed by physical vapor deposition by co-sputtering metallic Ti and Cr targets with $In_2O_3$ under an argon atmosphere to form In—Ti—Cr—O as the oxide semiconductor layer.

11. The method according to claim 8, wherein forming the oxide semiconductor layer comprises forming a first sub-layer in the trenches, and forming a second sub-layer on the first sub-layer, wherein the first sub-layer is formed by depositing the material represented by formula 1, and the second sub-layer is formed by depositing a material represented by formula 2:

$$In_xTi_zM_mO_n \qquad \text{[formula 2]}$$

wherein in formula 2, $0<x<1$, $0<z<1$, $0<m<1$, $0<n<1$, and M represents at least one metal.

12. The method according to claim 11, wherein the first sub-layer is formed as a crystalline layer, and the second sub-layer is formed as an amorphous layer.

13. The method according to claim 8, wherein a sum of x, y and m (x+y+m) in formula 1 is smaller than z.

14. The method according to claim 8, further comprising:
patterning the dielectric material and the oxide semiconductor layer to form third trenches; and forming a plurality of isolation pillars in the third trenches.

15. A method of forming a device, comprising:

forming a transistor structure over a substrate, wherein forming the transistor structure comprises:

forming a conductive line over the substrate;

forming a ferroelectric layer over the conductive line;

forming a first channel material represented by formula 1 over the ferroelectric layer, $$In_xSn_yTi_zM_mO_n \qquad \text{[formula 1]}$$

wherein in formula 1, $0<x<1$, $0\leq y<1$, $0<z<1$, $0<m<1$, $0<n<1$, and M represents at least one metal;

performing a thermal annealing process on the first channel material at a temperature of 1000° C. to 1600° C. to transform the first channel material to a crystalline state; and forming source and drain electrodes over the first channel material.

16. The method according to claim 15, wherein in formula 1, the metal M is at least one of Sc, V, Cr, Cu, Y, Nb, Ru, Ag and W.

17. The method according to claim 15, wherein a sum of x, y and m (x+y+m) in formula 1 is smaller than z.

18. The method according to claim 15, further comprising forming a second channel material represented by formula 2 over the first channel material prior to forming the source and drain electrodes, $$In_xTi_zM_mO_n \qquad \text{[formula 2]}$$

wherein in formula 2, $0<x<1$, $0<z<1$, $0<m<1$, $0<n<1$, and M represents at least one metal, and a compositional ratio of the second channel material is different from a compositional ratio of the first channel material.

19. The method according to claim 18, further comprising:

performing a thermal annealing process on the second channel material at a temperature of 200° C. to 400° C. to maintain an amorphous state of the second channel material.

\* \* \* \* \*